(12) United States Patent
Kyuno

(10) Patent No.: US 9,160,148 B2
(45) Date of Patent: Oct. 13, 2015

(54) METHOD OF MANUFACTURING SPARK PLUG

(71) Applicant: NGK SPARK PLUG CO., LTD., Nagoya (JP)

(72) Inventor: Jiro Kyuno, Kiyosu (JP)

(73) Assignee: NGK SPARK PLUG., LTD., Nagoya (JP)

( * ) Notice: Subject to any disclaimer, the term of this patent is extended or adjusted under 35 U.S.C. 154(b) by 31 days.

(21) Appl. No.: 14/078,896

(22) Filed: Nov. 13, 2013

(65) Prior Publication Data

US 2014/0141679 A1    May 22, 2014

(30) Foreign Application Priority Data

Nov. 19, 2012  (JP) .................................. 2012-253018
Nov. 27, 2012  (JP) .................................. 2012-258384
Oct. 25, 2013  (JP) .................................. 2013-222311

(51) Int. Cl.
  *H01T 13/60*   (2011.01)
  *H01T 21/02*   (2006.01)
  *H01T 21/06*   (2006.01)

(52) U.S. Cl.
  CPC ............... *H01T 21/02* (2013.01); *H01T 13/60* (2013.01); *H01T 21/06* (2013.01)

(58) Field of Classification Search
  CPC .......... H01T 13/58; H01T 13/60; H01T 21/02
  USPC ........................................................... 445/3
  See application file for complete search history.

(56) References Cited

U.S. PATENT DOCUMENTS

| 5,254,954 A | * | 10/1993 | Fujimoto et al. ............... 324/551 |
| 8,531,095 B2 | | 9/2013 | Ban et al. |
| 2012/0161605 A1 | | 6/2012 | Ban et al. |
| 2014/0065915 A1 | * | 3/2014 | Kyuno et al. ..................... 445/7 |
| 2014/0141680 A1 | * | 5/2014 | Kyuno .............................. 445/3 |

FOREIGN PATENT DOCUMENTS

| JP | 4625531 B | 11/2010 |
| JP | 4811932 B | 11/2011 |
| JP | 2012-185963 A | 9/2012 |

* cited by examiner

*Primary Examiner* — Andrew Coughlin
*Assistant Examiner* — Steven Horikoshi
(74) *Attorney, Agent, or Firm* — Leason Ellis LLP

(57) ABSTRACT

A method for manufacturing a spark plug includes: a preparation step of preparing a specimen provided with a center electrode, an insulator, a metal shell, and a ground electrode; and an inspection step of applying a predetermined voltage between the ground electrode and the center electrode of the prepared specimen, and determining whether dielectric breakdown is caused in the insulator. The inspection step includes a calculation step and a judgment step. The calculation step involves receiving an oscillating wave generated from the specimen upon application of the predetermined voltage to the specimen, obtaining a power spectrum by subjecting an oscillating wave signal representing the oscillating wave to fast Fourier transform, and then calculating an integral of a predetermined frequency range in the power spectrum. In the judgment step, whether discharge is caused by dielectric breakdown of the insulator is judged by utilizing the integral.

10 Claims, 15 Drawing Sheets

METHOD OF MANUFACTURING SPARK PLUG

This application claims the benefit of Japanese Patent Applications No. 012-253018, filed Nov. 19, 2012; No. 2012-258384, filed Nov. 27, 2012 and No. 2013-222311, filed Oct. 25, 2013, all of which are incorporated by reference in their entirety herein.

FIELD OF THE INVENTION

The present invention relates to a spark plug technology.

BACKGROUND OF THE INVENTION

Conventionally, a spark plug is used for igniting an internal combustion engine, such as a gasoline engine (see, for example, Japanese Patent No. 4625531). The spark plug includes a center electrode, an insulator disposed on the outer periphery of the center electrode, a metal shell disposed on the outer periphery of the insulator, and a ground electrode attached to the metal shell and forming a spark gap with the center electrode.

An inspection method for determining whether there is damage in a structural body using an acoustic emission method (which may be hereafter referred to as an "AE method") is also known (see, for example, Japanese Patent No, 4811932).

Problem to be Solved by the Invention

The dielectric strength of the insulator of the spark plug is one of important factors of spark plug performance. Conventionally, as a method for inspecting the insulator for dielectric breakdown, a method is known by which a predetermined voltage is applied between the center electrode and the ground electrode of the spark plug to make a determination based on an applied voltage waveform indicating a potential difference between the electrodes. Specifically, the determination is made based on the breakdown phenomenon in which an extreme drop in voltage value occurs in the applied voltage waveform. However, the breakdown phenomenon is not limited to insulator dielectric breakdown but may also occur when air discharge is caused. Thus, it is often difficult to determine the presence or absence of insulator dielectric breakdown based on the breakdown phenomenon. In the present specification, air discharge refers to a discharge not due to dielectric breakdown of the insulator 10 and includes normal discharge and the so-called "flash over". The normal discharge is a discharge produced between the center electrode and the ground electrode. The flash over is a phenomenon in which current flows from the center electrode to the metal shell via the insulator surface.

An inspection method that determines the presence or absence of insulator dielectric breakdown by the AE method is also conceivable. However, it may be difficult to distinguish between discharge due to dielectric breakdown and air discharge based on a raw waveform obtained by the AE method.

Further, when the dielectric breakdown of the insulator cannot be accurately determined as described above, the spark plugs in which normal discharge was caused may be eliminated from the manufacturing process, possibly resulting in a decrease in spark plug productivity.

SUMMARY OF THE INVENTION

The present invention was made to solve at least some of the problems discussed above, and may be implemented as follows.

(1) According to an embodiment of the present invention, a method for manufacturing a spark plug including a bar-like center electrode, an insulator disposed on an outer periphery of the center electrode, a metal shell disposed on an outer periphery of the insulator, and a ground electrode with one end attached to the metal shell for forming a spark gap with the center electrode is provided. The method for manufacturing a spark plug includes a preparation step of preparing a specimen including the center electrode, the insulator, the metal shell, and the ground electrode; and an inspection step of determining whether dielectric breakdown is caused in the insulator by applying a predetermined voltage between the ground electrode and the center electrode of the prepared specimen. The inspection step includes a calculation step where an oscillating wave generated from the specimen is received upon application of the predetermined voltage to the specimen, a power spectrum is determined by subjecting an oscillating wave signal representing the oscillating wave to fast Fourier transform, and an integral of a predetermined frequency range in the power spectrum is calculated, and a judgment step of judging whether discharge is caused by dielectric breakdown of the insulator by utilizing the integral. In the method for manufacturing a spark plug according to this embodiment, the power spectrum is obtained by subjecting the oscillating wave signal representing the oscillating wave generated from the specimen to fast Fourier transform, and the integral of the predetermined frequency range in the power spectrum is calculated to judge the presence or absence of dielectric breakdown in the insulator. Namely, the judgment step is performed by utilizing the integral of the power spectrum, whereby discharge due to dielectric breakdown in the insulator and discharge due to causes other than dielectric breakdown in the insulator can be accurately distinguished.

(2) In the method for manufacturing a spark plug according to the above embodiment, the judgment step may judge whether the discharge is caused by dielectric breakdown of the insulator by comparing the integral with a predetermined threshold. In the method for manufacturing a spark plug according to this embodiment, by comparing the integral and the predetermined threshold, the occurrence of discharge due to dielectric breakdown in the insulator can be easily identified.

(3) In the method for manufacturing a spark plug according to the above embodiment, the calculation step may include a step of calculating a ratio of a first integral which is the integral of a first frequency range included in the predetermined frequency range in the power spectrum, and a second integral which is the integral of a second frequency range included in the predetermined frequency range and different from the first frequency range, and the judgment step may judge whether discharge is caused by dielectric breakdown of the insulator based on the ratio. The intensity of the generated oscillating wave may be varied depending on the magnitude of the applied voltage. However, even if the magnitude of the power spectrum is varied, its shape does not change. Thus, in the method for manufacturing a spark plug according to this embodiment, by performing the judgment step based on the ratio of the first and the second integrals, the occurrence of discharge due to dielectric breakdown of the insulator can be easily identified according to a certain judgment criterion even when the magnitude of the voltage applied to the specimen is varied.

(4) In the method for manufacturing a spark plug according to the above embodiment, the predetermined frequency range may not be higher than 1 MHz. The oscillating wave produced by discharge due to dielectric breakdown of the insulator and other types of discharge (such as flash over) is predominantly not more than 1 MHz. Thus, in the method for manufacturing a spark plug according to this embodiment, the discharge due to dielectric breakdown of the insulator can be accurately identified while minimizing the data for making the judgment of discharge in the inspection step.

(5) In the method for manufacturing a spark plug according to the above embodiment, the inspection step may include, before applying the predetermined voltage, filling a space including a tip end of the center electrode with one of a compressed gas compressed to a pressure higher than atmospheric pressure and an insulating fluid. In the method for manufacturing a spark plug according to this embodiment, the space including the tip end of the center electrode can be filled with one of the compressed gas and the insulating fluid. Thus, the inspection step can be performed while the occurrence of normal discharge between the center electrode and the ground electrode is suppressed.

(6) The method for manufacturing a spark plug according to the above embodiment may further include a decision step of calculating, for each of a plurality of different frequency ranges of the power spectrum, a first specific integral which is the integral determined from the oscillating wave generated from the specimen by discharge due to dielectric breakdown of the insulator, and a second specific integral which is the integral determined from the oscillating wave generated from the specimen by discharge not due to dielectric breakdown of the insulator, and deciding on a specific frequency range such that the difference between the first and the second specific integrals is maximized from among the plurality of different frequency ranges. The calculation step may use the specific frequency range decided on in the decision step as the predetermined frequency range. In the method for manufacturing a spark plug according to this embodiment, the specific frequency range such that the difference between the first and the second specific integrals is maximized is used as the predetermined frequency range, whereby the judgment step of judging whether discharge is caused by dielectric breakdown in the insulator by utilizing the integral can be more accurately performed.

(7) The method for manufacturing a spark plug according to the above embodiment may further include a step of bending the ground electrode so as to bring another end of the ground electrode closer to the center electrode. The bending step may be performed after the inspection step. In the method for manufacturing a spark plug according to this embodiment, the inspection step can be performed by using the specimen prior to the formation of the spark gap by the bending step. Namely, according to this embodiment, the inspection step can be performed while the occurrence of normal discharge between the center electrode and the ground electrode is suppressed.

(8) The method for manufacturing a spark plug according to the above embodiment may further include an assembly step of assembling a gasket to an outer periphery of the metal shell after the inspection step. In the method for manufacturing a spark plug according to this embodiment, the inspection step can be performed without assembling components not required in the inspection step. Namely, the specimen judged to have caused discharge due to dielectric breakdown in the inspection step is handled as a defective article. Thus, the assembly of the gasket onto the defective article can be prevented.

(9) The method for manufacturing a spark plug according to the above embodiment may further include an elimination step of eliminating, after the inspection step, the specimen judged to have caused discharge due to dielectric breakdown of the insulator in the inspection step from the manufacturing process as a defective article. In the method for manufacturing a spark plug according to this embodiment, manufacturing of a defective article as a completed article can be prevented.

(10) In the method for manufacturing a spark plug according to the above embodiment, the insulator may include an axial hole extending in an axial line direction with the center electrode inserted into the axial hole on a front end side; the spark plug may include an annular space formed by an outer peripheral surface of the insulator and an inner peripheral surface of the metal shell and opened on the front end side; and the inspection step may further include a determination step of applying the predetermined voltage to the specimen after the judgment step, imaging an area including at least the center electrode, the insulator, and the annular space from the front end side in the axial line direction upon application of the predetermined voltage, and determining the presence or absence of dielectric breakdown based on an image obtained by the imaging. In the method for manufacturing a spark plug according to this embodiment, whether dielectric breakdown is caused in the insulator can be more reliably determined.

The flash over is a discharge that craws over the tip end face of the insulator. On the other hand, through discharge is a discharge caused in the annular space by through the insulator without crawling over the tip end face of the insulator.

In light of this, in the method for manufacturing a spark plug according to this embodiment, the area including at least the center electrode, the insulator, and the annular space is imaged from the front end side in the axial line direction upon application of the voltage to the center electrode, and the presence or absence of dielectric breakdown is determined based on the captured image. For example, when the discharge is present in an area of the captured image in which the insulator tip end face is positioned, it can be determined that flash over was caused and dielectric breakdown was not caused. On the other hand, when no discharge is present in the area of the captured image in which the insulator tip end face is positioned while discharge is present in the annular space, it can be determined that through discharge was caused and that dielectric breakdown was caused in the insulator.

(11) In the method for manufacturing a spark plug according to the above embodiment, the time of acquiring the image by imaging and the timing of application of the voltage to the center electrode may be controlled based on a single common signal.

In the method for manufacturing a spark plug according to this embodiment, the time (timing) of acquisition of the image by imaging and the timing of application of the voltage to the center electrode can be easily aligned, whereby the spark plug can be more reliably imaged during the application of the voltage to the center electrode (when the discharge is being caused momentarily). Thus, the presence or absence of dielectric breakdown can be determined more accurately based on the captured image, whereby the inspection accuracy can be increased.

(12) In the method for manufacturing a spark plug according to the above embodiment, the presence or absence of dielectric breakdown may be determined on the basis of information based on the brightness of an area of the captured image including the insulator and the annular space, and a preset threshold.

Because flash over and through discharge are different modes of discharge, the information based on brightness in the case of flash over and the information based on brightness in the case of through discharge are different.

In the method for manufacturing a spark plug according to this embodiment, the presence or absence of dielectric breakdown in the insulator can be automatically determined. Thus, the inspection accuracy can be further increased, and the inspection time can be decreased.

As examples of the method for determining the presence or absence of dielectric breakdown based on the brightness-based information and the threshold, the following methods (13) to (16) may be cited.

(13) In the method for manufacturing a spark plug according to the above embodiment, the information may include the brightness of each pixel in the area, a binarized image may be obtained by subjecting the area to a binarization process based on the brightness of each pixel and the threshold, the coordinates of the center of gravity of a portion of the binarized image exhibiting higher brightness may be calculated, and the presence or absence of dielectric breakdown may be determined based on the coordinates of the center of gravity.

When through discharge is caused, because the discharge is present in the area in which the annular space is positioned, a high brightness portion is present on a side spaced apart from the center electrode in an area including the insulator and the annular space in the captured image. On the other hand, when flash over is caused, discharge is present in such a manner as to connect the center electrode and the metal shell in the captured image, so that the high brightness portion is also present on the center electrode side in the area.

In the method for manufacturing a spark plug according to this embodiment, the coordinates of the center of gravity of the portion of the binarized image exhibiting higher brightness (high brightness portion due to discharge) are calculated, and the presence or absence of dielectric breakdown is determined based on the coordinates of the center of gravity. For example, when the coordinates of the center of gravity are present on the center side of the center electrode, it can be determined that flash over was caused and dielectric breakdown was not caused. On the other hand, when the coordinates of the center of gravity are present at a position spaced apart from the center of the center electrode, it can be judged that through discharge was caused and dielectric breakdown was caused. Namely, according to the above configuration 4, the presence or absence of dielectric breakdown can be accurately determined based on the difference in the position of the generated discharge between through discharge and flash over.

(14) In the method for manufacturing a spark plug according to the above embodiment, the information may include the brightness of each pixel in the area, the area may be subjected to a binarization process based on the brightness of each pixel and the threshold to obtain a binarized image, and the presence or absence of dielectric breakdown may be determined based on whether a portion of the binarized image exhibiting higher brightness is continuous from an area in which the center electrode is positioned to an area in which the annular space is positioned.

In the method for manufacturing a spark plug according to this embodiment, the presence or absence of dielectric breakdown is determined based on whether the portion (high brightness portion due to discharge) of the binarized image exhibiting higher brightness is continuous from the area in which the center electrode is positioned to the area in which the annular space is positioned. For example, when the portion exhibiting higher brightness is continuous from the area in which the center electrode is positioned to the area in which the annular space is positioned, it can be judged that flash over was caused and dielectric breakdown was not caused. On the other hand, when the portion exhibiting higher brightness is not continuous from the area in which the center electrode is positioned to the area in which the annular space is positioned, it can be judged that through discharge was caused and dielectric breakdown was caused. Namely, according to the configuration 5, the presence or absence of dielectric breakdown can be accurately determined based on the difference in the position of the generated discharge between through discharge and flash over.

(15) In the method for manufacturing a spark plug according to the above embodiment, the information may include an mean brightness in the area, and the presence or absence of dielectric breakdown may be determined by comparing the mean brightness and the threshold.

In the case of through discharge, discharge is produced in the annular space, so that the light due to the discharge does not easily reach the front end side in the axial line direction (i.e., the imaging device for obtaining the image by imaging). Thus, when through discharge is caused, the captured image becomes generally dark, with a number of pixels in the area having small brightness. On the other hand, in the case of flash over, the discharge crawls over the tip end face of the insulator, so that the light due to discharge can easily reach the front end side in the axial line direction (the imaging device). Thus, when flash over is caused, the captured image becomes generally light, and a number of pixels in the area has high brightness.

In the method for manufacturing a spark plug according to this embodiment, the mean brightness in the area and the threshold are compared to determine the presence or absence of dielectric breakdown. For example, when the mean brightness is not less than the threshold, it can be determined that flash over was caused and dielectric breakdown was not caused. On the other hand, when the mean brightness is less than the threshold, it can be judged that through discharge was caused and dielectric breakdown was caused. Namely, in the method for manufacturing a spark plug according to this embodiment, the presence or absence of dielectric breakdown can be more reliably determined based on the difference in brightness of the captured image depending on the position of the generated discharge.

(16) In the method for manufacturing a spark plug according to the above embodiment, the information may include the brightness of each pixel in the area, and the presence or absence of dielectric breakdown may be determined based on a total quantity of the pixels having brightness such that a preset relationship is satisfied when compared with the threshold.

In the method for manufacturing a spark plug according to this embodiment, the presence or absence of dielectric breakdown is determined based on the total quantity of the pixels in the area that satisfy the predetermined relationship. For example, when the total quantity of the pixels satisfying the preset relationship (such as the brightness not less than the threshold) when compared with the threshold is not less than a predetermined value, it can be judged that flash over was caused and dielectric breakdown was not caused. On the other hand, when the total quantity of the pixels satisfying the relationship (such as the brightness not less than the threshold) when compared with the threshold is less than the predetermined value, it can be judged that through discharge was caused and dielectric breakdown was caused. Namely, in the method for manufacturing a spark plug according to this embodiment, the presence or absence of dielectric breakdown can be more reliably determined based on the difference in brightness of each pixel depending on the difference in the position of the generated discharge.

For the inspection, any one of the configurations (13) to (16) may be used, or two or more of the configurations (13) to (16) may be used.

In the method for manufacturing a spark plug according to the above embodiment, a differential value of the voltage applied to the center electrode may be obtained, and the presence or absence of dielectric breakdown may be determined based on the captured image when the differential value is not less than a preset determination implementation threshold, or when the differential value is more than the determination implementation threshold.

In the method for manufacturing a spark plug according to this embodiment, the presence or absence of dielectric breakdown is not determined for all of the images obtained by imaging. Instead, the presence or absence of dielectric breakdown is determined when the differential value of the voltage applied to the center electrode is not less than the determination implementation threshold or more than the determination implementation threshold. Namely, only the spark plugs in which discharge (flash over or through discharge) was caused between the center electrode and the metal shell upon application of the voltage to the center electrode are considered as the targets for inspection. Thus, the processing burden during inspection can be decreased, and the inspection time can be further shortened.

The present invention can be implemented in various forms, such as in the form of a spark plug inspection method, a spark plug, or an internal combustion engine of a vehicle fitted with a spark plug.

BRIEF DESCRIPTION OF THE DRAWINGS

These and other features and advantages of the present invention will become more readily appreciated when considered in connection with the following detailed description and appended drawings, wherein like designations denote like elements in the various views, and wherein:

FIG. 11 is a timing chart indicating timings of opening of a shutter, application of voltage with respect to central voltage, and the like.

DETAILED DESCRIPTION OF THE INVENTION

Description of Embodiments

In the following, embodiments of the present invention will be described in the following order: A. First embodiment; B. Second embodiment; C. Third embodiment; and D. Modification.

A. First Embodiment

A-1: Configuration of Spark Plug

Figure 1:
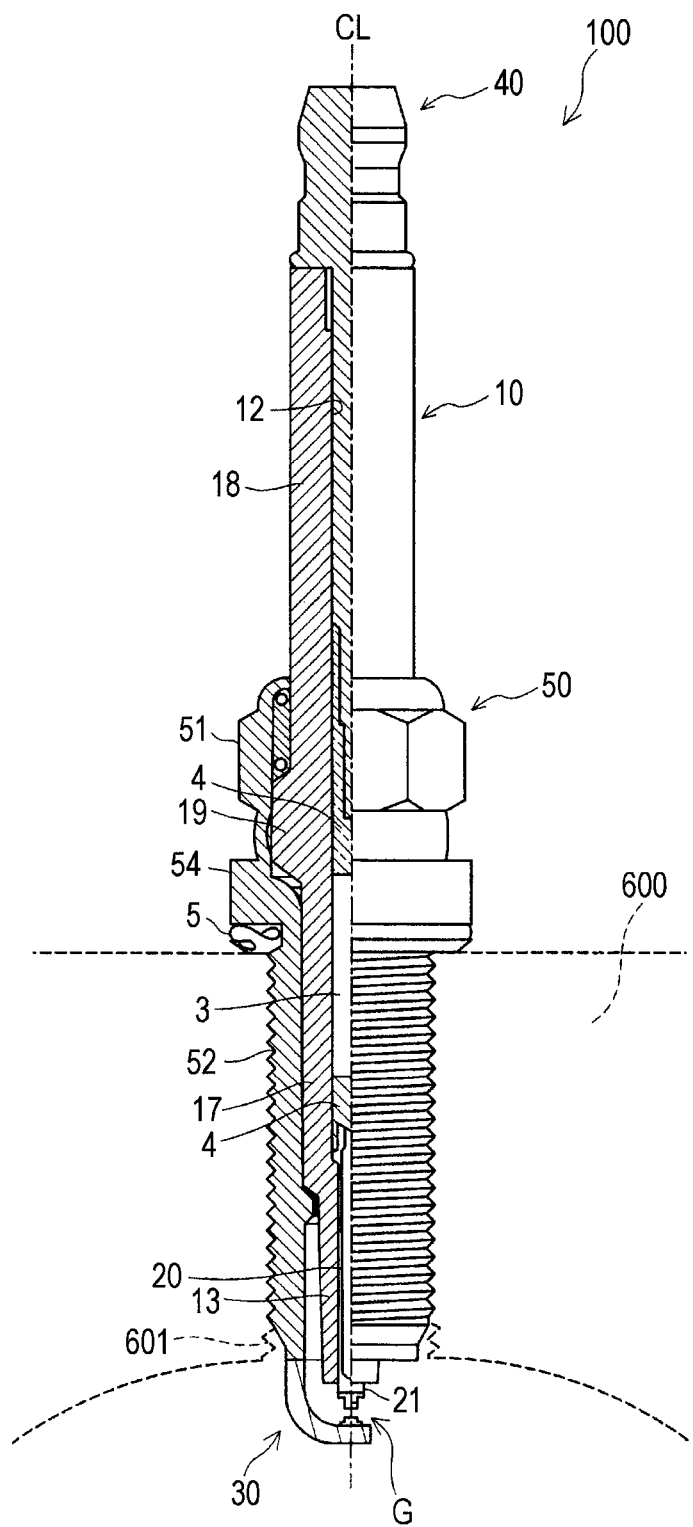
FIG. 1 is a partial cross-sectional view of a spark plug 100 according to a first embodiment of the present invention.

FIG. 1 is a partial cross-sectional view of a spark plug 100 according to the first embodiment of the present invention. For the purpose of description of the spark plug 100, the upper side and the lower side of the drawing may be referred to as "one end side" (rear end side) and the "other end side" (front end side), respectively. The spark plug 100 includes a bar-like center electrode 20, an insulator 10 as an insulator disposed on the outer periphery of the center electrode 20, a metal shell 50 disposed on the outer periphery of the insulator 10, and a ground electrode 30 with one end positioned on the rear end side and attached to the metal shell 50.

The center electrode 20 is electrically coupled to a terminal metal fitting 40 disposed on one end of the insulator 10 through the insulator 10. The center electrode 20 is held by the insulator 10. The insulator 10 is held by the metal shell 50. The ground electrode 30 is bent such that the other end is opposite the center electrode 20 at the bottom of the center electrode 20. By the bending of the ground electrode 30, a spark gap G for producing a spark is formed between the ground electrode 30 and the center electrode 20. The spark plug 100 is installed in an installation thread opening 601 of an engine head 600 of an internal combustion engine via the metal shell 50. For example, when a high voltage of 20 to 30 thousand volts is applied to the terminal metal fitting 40, a spark is produced in the spark gap G between the center electrode 20 and the ground electrode 30.

The insulator 10 is an insulator formed by firing a ceramic material, such as alumina. The insulator 10 is a tubular member with an axial hole 12 formed at the center for housing the center electrode 20 and the terminal metal fitting 40. The insulator 10 includes a middle body portion 19 in the middle in an axial line CL direction of the spark plug 100, with a greater external diameter than other portions of the insulator 10. Toward the terminal metal fitting 40 (the one end side) with respect to the middle body portion 19, a rear end-side body portion 18 for insulating between the terminal metal fitting 40 and the metal shell 50 is formed. Toward the center electrode 20 with respect to the middle body portion 19, a front end-side body portion 17 with a smaller external diameter than the rear end-side body portion 18 is formed. Further beyond the front end-side body portion 17, an insulator nose portion 13 with an external diameter smaller than the front end-side body portion 17 and becoming smaller toward the center electrode 20 (the other end side) is formed.

The metal shell 50 is a cylindrical metal shell surrounding and holding a portion of the insulator 10 from a part of the rear end-side body portion 18 to the insulator nose portion 13. The metal shell 50 may be formed of metal, such as low-carbon steel as used in the present example. The metal shell 50 includes a tool engaging portion 51, an installation thread portion 52, and a sealing portion 54. The tool engaging portion 51 of the metal shell 50 is configured for fitting engagement with a tool (not shown) for installing the spark plug 100 onto the engine head 600. The installation thread portion 52 of the metal shell 50 has threads for threaded engagement with the installation thread opening 601 of the engine head 600. The sealing portion 54 of the metal shell 50 is formed in the shape of a flange at the root of the installation thread portion 52. Between the sealing portion 54 and the engine head 600, an annular gasket 5 formed by bending a sheet material is inserted.

The center electrode 20 includes a tip end 21 protruding from the axial hole 12 of the insulator 10. Namely, the center electrode 20 is inserted into the axial hole 12 of the insulator 10 with the tip end 21 protruding from the axial hole 12, and is electrically coupled to the terminal metal fitting 40 through a ceramic resistor 3 and a sealing member 4. Further, at the tip end of the spark plug 100, an annular space 29 is formed by an outer peripheral surface of the insulator 10 (insulator nose portion 13) and an inner peripheral surface of the metal shell 50. The annular space 29 is opened on the front end side.

A-2. Method for Manufacturing Spark Plug

Figure 2:
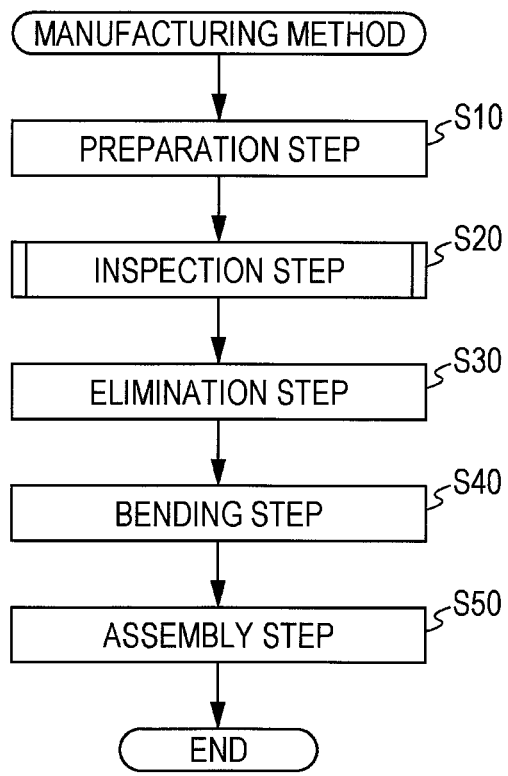
FIG. 2 is a flow chart of a method for manufacturing the spark plug.

FIG. 2 is a flowchart of a method for manufacturing the spark plug. First, a specimen 100*t* used for an inspection step to be described below (step S20) is prepared (step S10). As the specimen 100*t*, an item of the spark plug 100, shown as a completed article in FIG. 1, with the ground electrode 30 extending straight from the metal shell 50 and without the gasket 5 is used. After the preparation step (step S10), the inspection step is performed (step S20). In the inspection step, it is determined whether dielectric breakdown is caused in the insulator 10 when a predetermined voltage (such as 40 kV) is applied between the ground electrode 30 and the center electrode 20 of the prepared specimen 100*t* (step S20). The details of the inspection step (step S20) will be described below.

After the inspection step, an elimination step is performed (step S30). In the elimination step, the specimen 100*t* determined to have caused discharge due to dielectric breakdown of the insulator 10 is eliminated from the manufacturing process as a defective article.

After the elimination step, a bending step is performed (step S40). In the bending step, the ground electrode 30 of the specimen 100*t* is bent such that the other end of the ground electrode 30 is located close to the center electrode 20 until the spark gap G (FIG. 1) is formed. After the bending step, an assembly step is performed (step S50). In the assembly step, the gasket 5 is assembled onto the outer periphery of the metal shell 50 of the specimen 100*t*. In this way, a completed article of the spark plug 100 is manufactured. The order of the bending step and the assembly step is not particularly limited; for example, the bending step is performed after the assembly step.

Figure 3:
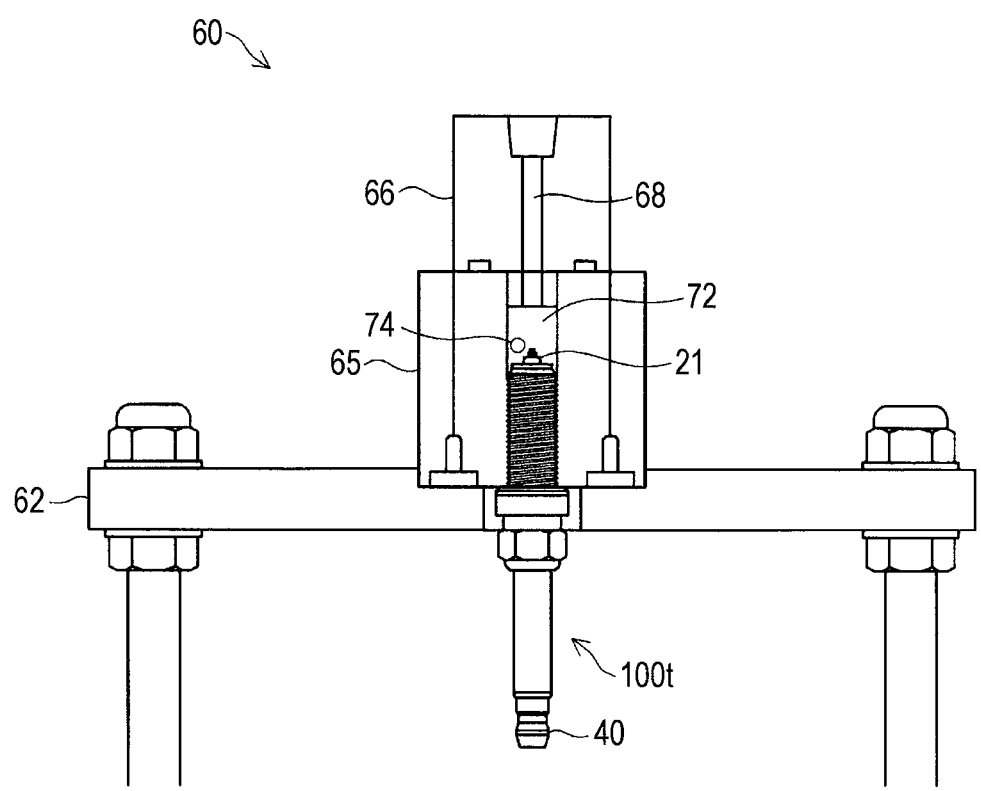
FIG. 3 is a diagram illustrating an inspection device 60 used in an inspection step.

FIG. 3 is a diagram illustrating an inspection device 60 used in the inspection step. FIG. 3 also illustrates the specimen 100*t* set on the inspection device 60. For ease of understanding, the internal structure of the inspection device 60 and a part of the specimen 100*t* disposed inside the inspection device 60 are also drawn by solid lines.

The inspection device 60 includes an installation mount 62, a casing 65, a pressurizing cap 66, and an acoustic emission sensor (which may also be referred to as "AE sensor") 74. The installation mount 62 has a through-hole through which the specimen 100*t* is installed on the inspection device 60. The pressurizing cap 66 is of a bottomed tubular shape, in which the front end-side portion of the specimen 100*t* is disposed. Specifically, when the specimen 100*t* is mounted on the pressurizing cap 66, a space 72 is formed inside the pressurizing cap 66. In the space 72, the front end-side portion of the specimen 100*t* including the tip end 21 of the center electrode 20 is disposed. When the specimen 100*t* is installed on the inspection device 60, the ground electrode 30 is grounded.

In the pressurizing cap 66, a circulation flow passage 68 for providing communication between the outside and the space 72 formed inside the pressurizing cap 66 is formed. In the inspection step, the space 72 is filled with one of an insulating fluid and a compressed gas (compressed air) compressed to a pressure higher than atmospheric pressure, via the circulation flow passage 68. According to the present embodiment, compressed air is used. When compressed gas is used, the space 72 is pressurized to a predetermined pressure (such as 0.8 MPa to 3.5 MPa).

The casing 65 is disposed around the pressurizing cap 66. The casing 65 is fitted with the AE sensor 74. The AE sensor 74 is electrically connected to a personal computer (PC) (not shown). The AE sensor 74 receives an oscillating wave produced when a predetermined voltage is applied between the ground electrode 30 and the center electrode 20, and converts the oscillating wave into an oscillating wave signal. The oscillating wave signal is analyzed by an analyzing program built in the PC. The details of the analysis performed in the inspection step will be described below.

Figure 4:
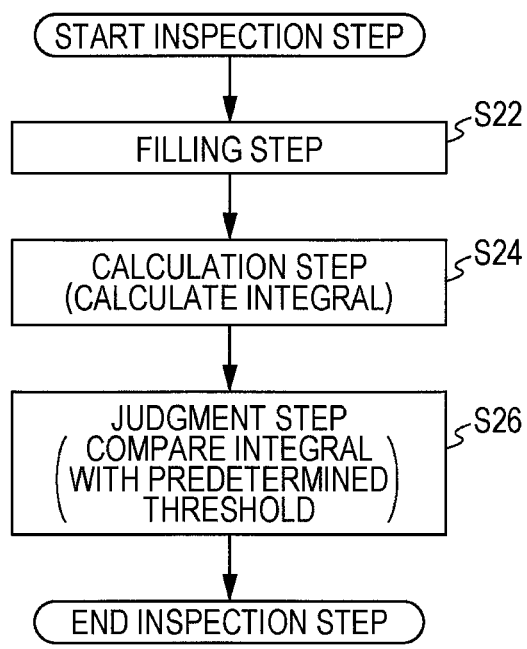
FIG. 4 is a detailed flow of the inspection step.

FIG. 4 is a detailed flow of the inspection step. The inspection step is started after the specimen 100*t* is installed on the inspection device 60. The inspection step includes a filling step (step S22), a calculation step (step S24), and a judgment step (step S26).

The filling step is a step in which the space 72 including the tip end 21 (FIG. 3) is filled with one of the compressed gas and the insulating fluid via the circulation flow passage 68, and is then pressurized to a predetermined pressure higher than atmospheric pressure (step S22).

The calculation step is performed by the following procedure (step S24). First, the oscillating wave generated from the specimen 100*t* when the predetermined voltage is applied to the specimen 100*t* installed on the inspection device 60 is received by the AE sensor 74. The AE sensor 74 converts the received oscillating wave into the oscillating wave signal. The oscillating wave signal is subjected to fast Fourier transform (FFT) by the analyzing program in the PC, whereby a power spectrum is obtained. The analyzing program then calculates an integral of a predetermined frequency range (such as 800 kHz to 1000 kHz) of the power spectrum.

The judgment step judges whether the oscillating wave produced in the calculation step is due to discharge caused by dielectric breakdown of the insulator 10, based on the integral obtained in the calculation step (step S26). Specifically, in the judgment step, it is judged whether the discharge was caused by dielectric breakdown of the insulator 10 by comparing the integral with a predetermined threshold. In the present embodiment, in the judgment step, when the integral obtained in the calculation step is greater than the predetermined threshold, it is determined that air discharge was caused. When the integral obtained in the calculation step is smaller than the predetermined threshold, it is determined that discharge due to dielectric breakdown of the insulator 10 (which may be referred to as "through discharge") was caused (step S26).

A-3. Preliminary Preparation for Inspection Step

Figure 5:
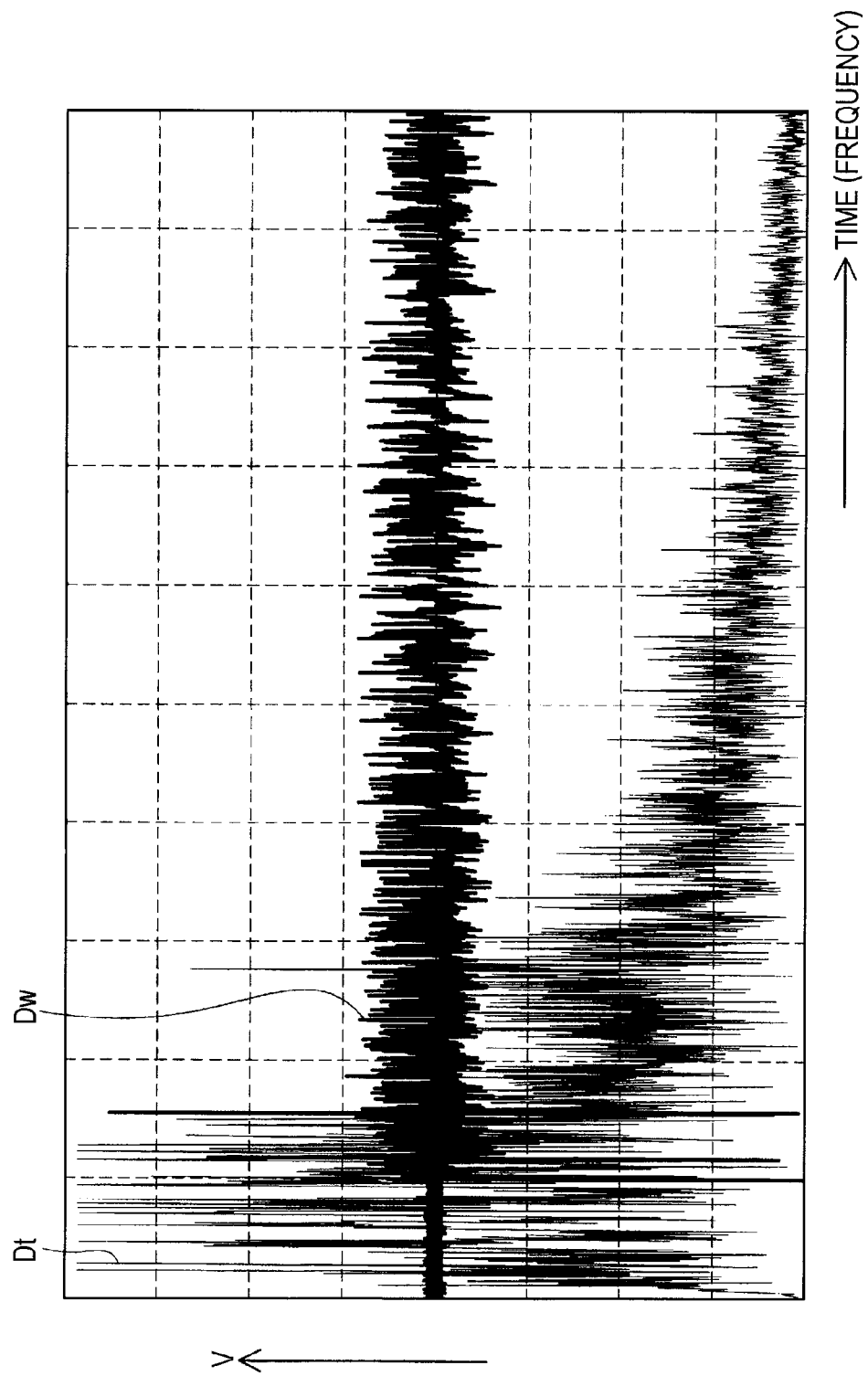
FIG. 5 is a chart indicating a raw waveform Dw of an oscillating wave and a FFT waveform DT.

FIG. 5 illustrates a raw waveform Dw of the oscillating wave acquired in the calculation step (step S24), and a FFT waveform (power spectrum) DT obtained by subjecting the raw waveform Dw to fast Fourier transform. The horizontal axis of FIG. 5 illustrates time for the raw waveform Dw and frequency for the power spectrum DT. The vertical axis of FIG. 5 illustrates voltage (V). FIG. 5 illustrates the waveforms due to through discharge or air discharge. However, the raw waveform Dw due to through discharge is similar to the raw waveform Dw due to air discharge, so that it is difficult to judge whether through discharge or air discharge was produced.

Thus, according to the present embodiment, the FFT waveform DT is determined from the raw waveform Dw, an integral of the FFT raw waveform DT is calculated, and then it is judged whether the discharge produced by the specimen 100t in the inspection step is through discharge or air discharge by utilizing the calculated integral. Before describing the reason for this, a step (decision step) of deciding on the predetermined threshold used in the judgment step of the inspection step will be described.

Figure 6:
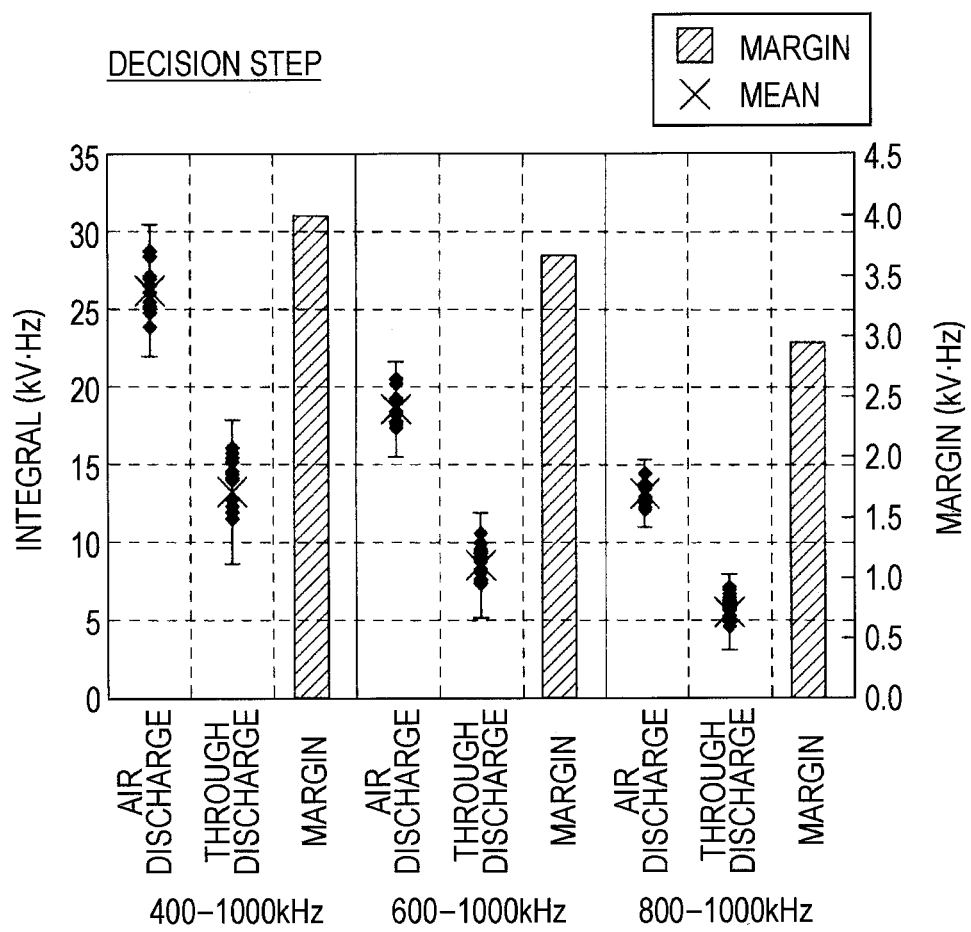
FIG. 6 is a chart indicating integral and margin.

FIG. 6 is a chart illustrating the integral and the margin. In FIG. 6, the left-side vertical axis represents the integral, and the right-side vertical axis represents the margin. The margin indicates the difference between the integral of air discharge and the integral of through discharge, as will be described below. According to the present embodiment, the margin indicates the difference between the lowest value of the mean±3σ (σ is a standard deviation) of the integrals of a plurality of air discharges calculated from a plurality of specimens 100t, and the highest value of the mean±3σ (σ is a standard deviation) of the integrals of a plurality of through discharges calculated from a plurality of specimens 100t. In FIG. 6, the "air discharge" on the horizontal axis indicates the specimen 100t in which only air discharge was produced in the inspection step (step S20), while the "through discharge" indicates the specimen 100t in which only through discharge was produced in the inspection step (step S20).

The graph of air discharge and through discharge shown in FIG. 6 was prepared as follows. A predetermined voltage was applied to each of a plurality of the specimens 100t using the inspection device 60 under the same condition, and the oscillating wave was received by the AE sensor 74. Then, the power spectrum DT was obtained using the analyzing program, and the integral in the predetermined frequency range was calculated. With respect to the specimens 100t in which discharge was caused when the predetermined voltage was applied by the inspection device 60, it was judged whether through discharge or air discharge was caused in accordance with a standard described below. Namely, it was visually determined whether dielectric breakdown was caused in the insulator 10. Specifically, the specimens 100t in which dielectric breakdown was caused were considered to be the specimens 100t in which through discharge was caused, and the specimens 100t in which no dielectric breakdown was caused were considered to be the specimens 100t in which air discharge was caused. Then, the integrals in the specimens 100t in which air discharge was caused were plotted as the integrals for "air discharge" in FIG. 6. The integrals in the specimens 100t in which through discharge was caused were plotted as the integrals for "through discharge" in FIG. 6. The graph of "air discharge" and "through discharge" was created for each of three different frequency ranges of the power spectrum DT. According to the present embodiment, the graphs were prepared for the frequency ranges of (i) 400 to 1000 kHz, (ii) 600 to 1000 kHz, and (iii) 800 to 1000 kHz. The range of the bars in each graph of "air discharge" and "through discharge" is the mean±3σ (σ is a standard deviation). The range of the bars may be set in view of the variations of the integrals with respect to actual measurement values, and is not limited to the above embodiment. For example, the upper limit value and the lower limit value of the actual measurement value are set as the upper limit value and the lower limit value, respectively, of the bar.

As shown in FIG. 6, in any of the frequency ranges, the integrals of the power spectrum DT are positioned in different integral ranges between air discharge and through discharge. Namely, the preparation step (step S10), and the filling step (step S22) and the calculation step (step S24) in the inspection step are performed in advance, and the integrals are classified into those in the case of through discharge (which may be referred to as a "first specific integral") and those in the case of air discharge (which may be referred to as a "second specific integral"). In this way, a first specific integral range in which the first specific integrals are distributed, and a second specific integral range in which the second specific integrals are distributed can be determined. Then, an integral between the first specific integral range and the second specific integral range is determined as a predetermined threshold prior to starting the inspection step. For example, a chart such as the one shown in FIG. 6 is prepared before the start of the inspection step. In the case of 400 to 1000 kHz of FIG. 6, for example, an integral (such as 20 kV·Hz) positioned between the integral range for "air discharge" and the integral range for "through discharge" is set as the predetermined threshold.

Preferably, the predetermined frequency ranges used in the calculation step may be ranges not higher than 1000 kHz (1 MHz). The oscillating waves produced by through discharge or air discharge are predominantly not more than 1000 kHz. Thus, by setting the predetermined frequency ranges in ranges not more than 1000 kHz, the discharge due to dielectric breakdown can be accurately judged while minimizing the data for making the decision on discharge in the inspection step.

Preferably, the predetermined frequency ranges may be determined as follows. Namely, as shown in FIG. 6, the first specific integral determined from the oscillating wave generated from the specimen 100t due to discharge caused by dielectric breakdown of the insulator 10, and the second specific integral determined from the oscillating wave generated from the specimen 100t due to air discharge are calculated for each of the different frequency ranges. Then, a specific frequency range such that the difference (margin) between the first specific integral and the second specific integral is maximized is decided from among the different frequency ranges (decision step). For example, in FIG. 6, 400 to 1000 kHz is decided as the specific frequency range. In this way, the judgment step of judging whether discharge was caused by dielectric breakdown based on the integral can be more accurately performed. The first specific integral and the second specific integral may be each a single integral, or may have a predetermined numerical range in which a plurality of integrals is distributed, as according to the present embodiment.

A-4. Effects

According to the first embodiment, the presence or absence of dielectric breakdown is judged by calculating the integral of a predetermined frequency range in the power spectrum (step S26 in FIG. 4). Namely, by performing the judgment step by utilizing the integral of the power spectrum, through discharge and air discharge can be distinguished accurately.

Further, according to the first embodiment, by comparing the integral calculated in the calculation step with a predetermined threshold, the occurrence of through discharge can be easily identified.

Further, according to the first embodiment, the space 72 is filled with one of compressed air and insulating fluid in the filling step (FIGS. 3 and 4). Thus, the inspection step can be performed by applying a high voltage to the specimen 100t while the occurrence of normal discharge is suppressed.

Further, according to the first embodiment, the specimen 100t used in the inspection step is the spark plug before the bending step. Thus, the inspection step can be performed by using the specimen 100t prior to the formation of the spark gap according to design. As a result, the inspection step can be performed while the occurrence of normal discharge between the center electrode 20 and the ground electrode 30 is suppressed.

According to the first embodiment, the inspection step (step S20) can be performed without assembling components not required in the inspection step (step S20). Namely, the specimen 100t judged to have caused discharge due to dielectric breakdown in the inspection step (step S20) is handled as a defective article. Thus, the assembling of the gasket to the defective article can be prevented.

Further, according to the first embodiment, the specimen 100t judged to have caused discharge due to dielectric breakdown is eliminated as a defective article (step S30). Thus, the defective article can be prevented from being manufactured as a completed article, whereby the spark plug 100 with superior dielectric strength of the insulator 10 can be manufactured.

B. Second Embodiment

B-1. Method for Manufacturing Spark Plug

Figure 7:
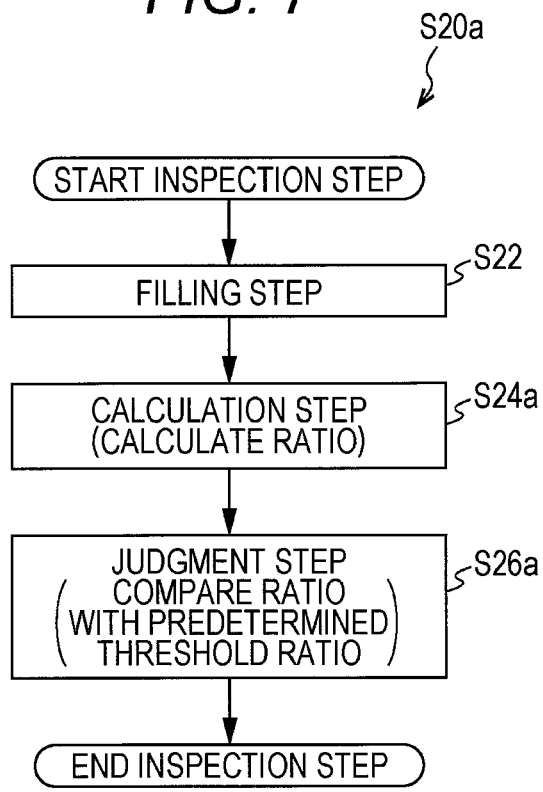
FIG. 7 is a flowchart of the inspection step according to a second embodiment.

FIG. 7 is a flowchart of the inspection step (step S20a) according to the second embodiment. In the method for manufacturing the spark plug, the second embodiment differs from the first embodiment in the contents of the inspection step and is similar to the first embodiment regarding the contents of the other steps (such as the preparation step). Thus, the description of steps with similar contents as those according to the first embodiment will be omitted.

The calculation step according to the second embodiment is performed by the following procedure (step S24a). As according to the first embodiment, the oscillating wave signal is subjected to FFT to obtain the power spectrum DT. A predetermined frequency range (such as 0 to 500 kHz) is divided into a first frequency range and a second frequency range that do not overlap with each other. For example, according to the present embodiment, the first frequency range is 0 to 250 kHz, and the second frequency range is 250 to 500 kHz. Then, of the power spectrum DT, the integral of the first frequency range (which may be also referred to as a "first integral") and the integral of the second frequency range (which may be also referred to as a "second integral") are calculated. Thereafter, the ratio of the first integral and the second integral is calculated. According to the second embodiment, the ratio is (first integral)/(second integral).

In the judgment step, based on the ratio determined in the calculation step, it is judged whether the oscillating wave produced in the calculation step is due to discharge caused by dielectric breakdown of the insulator 10 (step S26a). Specifically, in the judgment step, it is judged whether the discharge was caused by dielectric breakdown by comparing the ratio with a predetermined threshold determined in advance. According to the second embodiment, the predetermined threshold is the ratio of (first integral/second integral).

According to the second embodiment, the occurrence of discharge due to dielectric breakdown can be easily judged according to a certain judgment criterion even when the magnitude of the voltage applied to the specimen 100t in the calculation step is varied. In the following, the reason for this will be described with reference to FIGS. 8 and 9.

Figure 8:
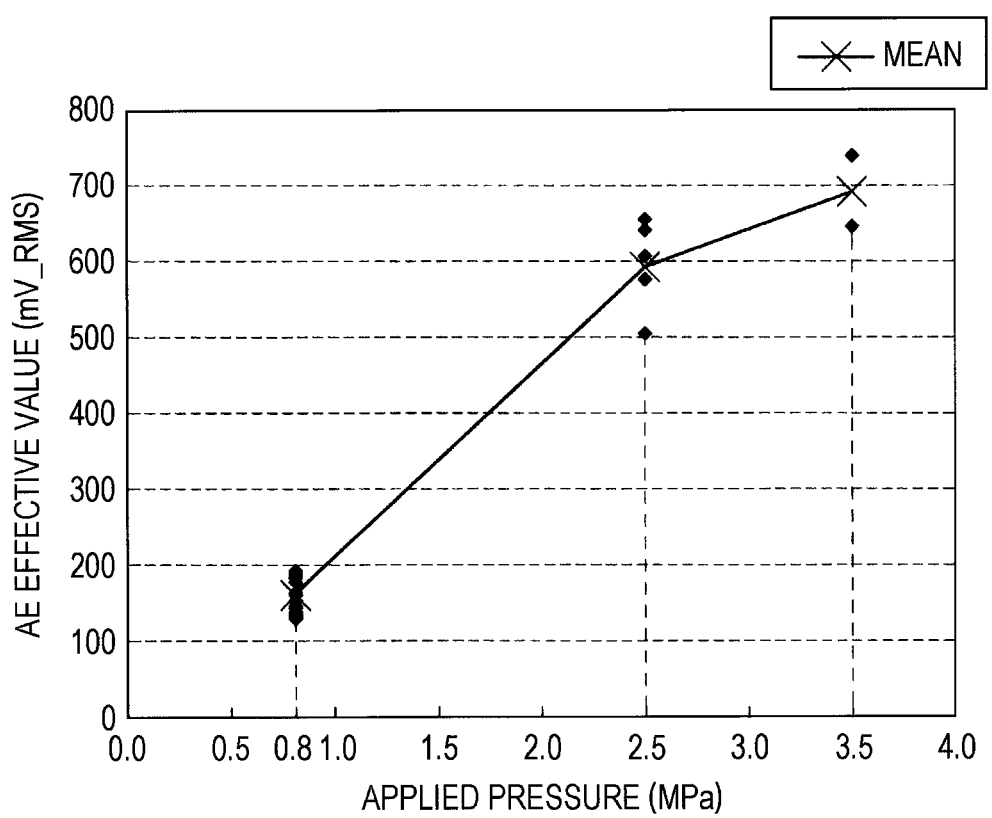
FIG. 8 is a chart indicating the relationship between pressurizing force and the effective value of an AE waveform.

FIG. 8 is a chart indicating the relationship between pressurizing force and the effective value (AE effective value) of acoustic emission waveform (AE waveform). The AE effective value shown on the vertical axis of FIG. 8 is generally referred to as "AE energy", indicating the relative value of the energy of the waveform. The pressurizing force shown on the horizontal axis of FIG. 8 indicates the pressure of the compressed gas introduced into the space 72. FIG. 8 is a chart of the calculated AE effective value of the acoustic emission generated from the specimen 100t when the pressure of the compressed gas introduced into the space 72 was varied. The AE effective value was also calculated by using a plurality of specimens 100t for each pressure of the compressed gas introduced into the space 72. In FIG. 8, the mean of the AE effective values plotted at each pressure is also plotted.

In FIG. 8, the AE effective value was calculated and plotted for each of three different pressures of 0.8 MPa, 2.5 MPa, and 3.5 MPa. The greater the pressurizing force, the more the voltage applied to the specimen 100t was increased. It will be seen from FIG. 8 that the greater the pressurizing force (applied voltage), the greater the AE effective value becomes. Namely, in the calculation step, when the magnitude of the voltage applied to the specimen 100t is changed, the predetermined threshold needs to be reset for each applied voltage when an integral is used as the predetermined threshold.

Figure 9:
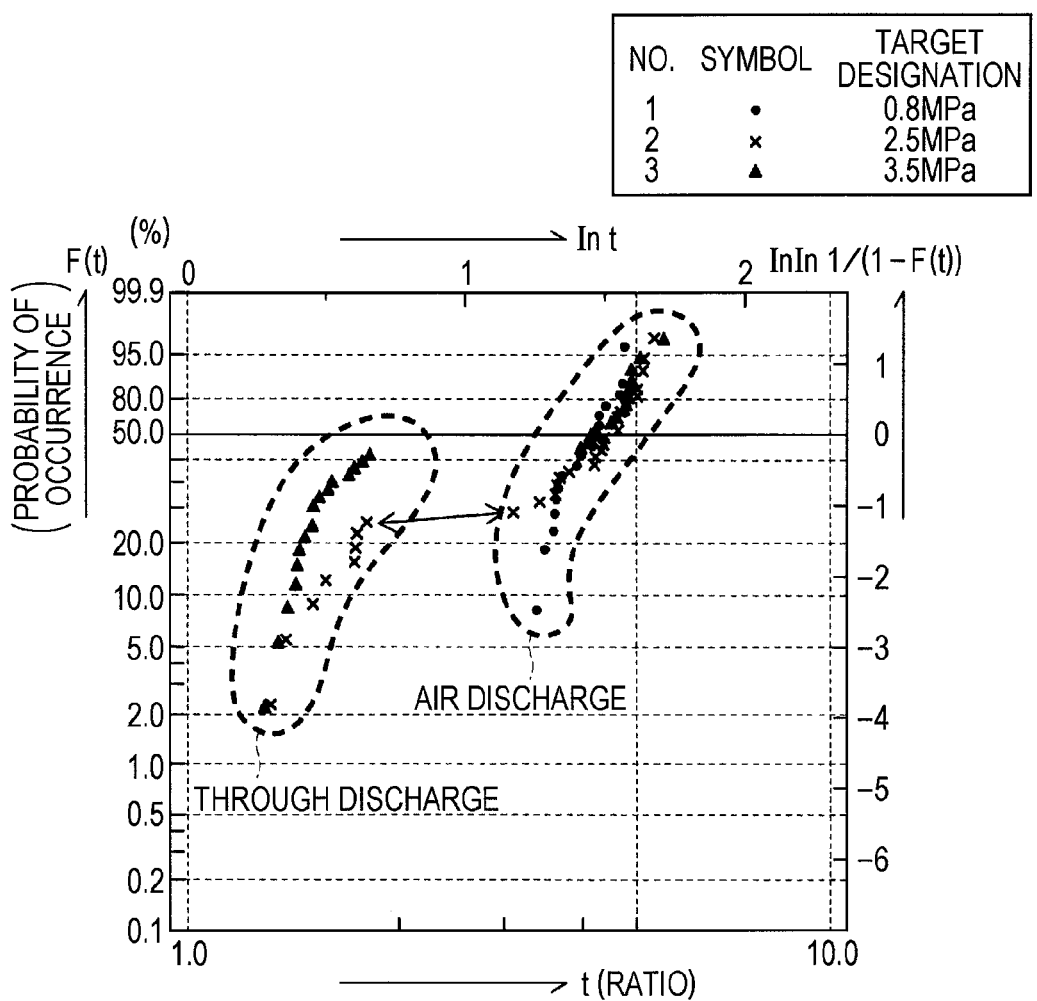
FIG. 9 is a chart of integral ratio and converted occurrence probability.

FIG. 9 is a chart of the integral ratio and its conversion into occurrence probability. The horizontal axis represents the ratio (first integral/second integral), and the vertical axis on the left represents the occurrence probability (%). The chart of FIG. 9 shows the occurrence probability calculated for each ratio by Weibull analysis by calculating the power spectrum by using a plurality of the specimens 100t for each of the three different pressures, as in FIG. 8, and determining the ratio of the first integral and the second integral (first integral/second integral). Meanwhile, it was visually confirmed whether dielectric breakdown was caused in the insulator 10 of the specimen 100t after determining the ratio, and it was judged whether through discharge or air discharge was caused. In FIG. 9, the points plotted in the enclosed area on the left side indicate the specimens 100t in which through discharge was caused, and the points plotted in the enclosed area on the right indicate the specimens 100t in which air discharge was caused.

As shown in FIG. 9, even when the pressurizing force (i.e., the applied voltage) in the space 72 (FIG. 3) is changed, the ratio calculated from the power spectrum of through discharge and the ratio calculated from the power spectrum of air discharge are distributed in different areas. Further, even when the pressurizing force in the space 72 is changed, the ratio calculated from the power spectrum of through discharge is distributed in the same area (first area) regardless of the pressurizing force, and the ratio calculated from the power spectrum of air discharge is distributed in the same area regardless of the pressurizing force. Namely, the judgment step can be accurately performed by determining the ratio between the first area and the second area as the predetermined threshold used in the judgment step.

Namely, in the judgment step, the predetermined threshold determined in advance and the ratio calculated in the calculation step are compared. When the calculated ratio is smaller than the predetermined threshold, it is judged that through discharge was caused. When the ratio calculated in the calculation step is greater than the predetermined threshold, it is judged that air discharge was caused (step S26a).

B-2. Effects

According to the second embodiment, effects similar to those according to the first embodiment can be obtained with regard to steps or configurations similar to those of the first embodiment. According to the second embodiment, the judgment step is performed based on the ratio of the first integral and the second integral (step S26a), whereby the occurrence of through discharge can be easily judged according to a certain judgment criterion regardless of the magnitude of the voltage applied to the specimen 100t.

C. Third Embodiment

C-1. Method for Manufacturing Spark Plug

In the method for manufacturing the spark plug, the third embodiment is similar to the first embodiment in the inspection step and the other steps (such as the preparation step). Thus, the description of steps with the same contents as those of the first embodiment will be omitted.

Figure 10:
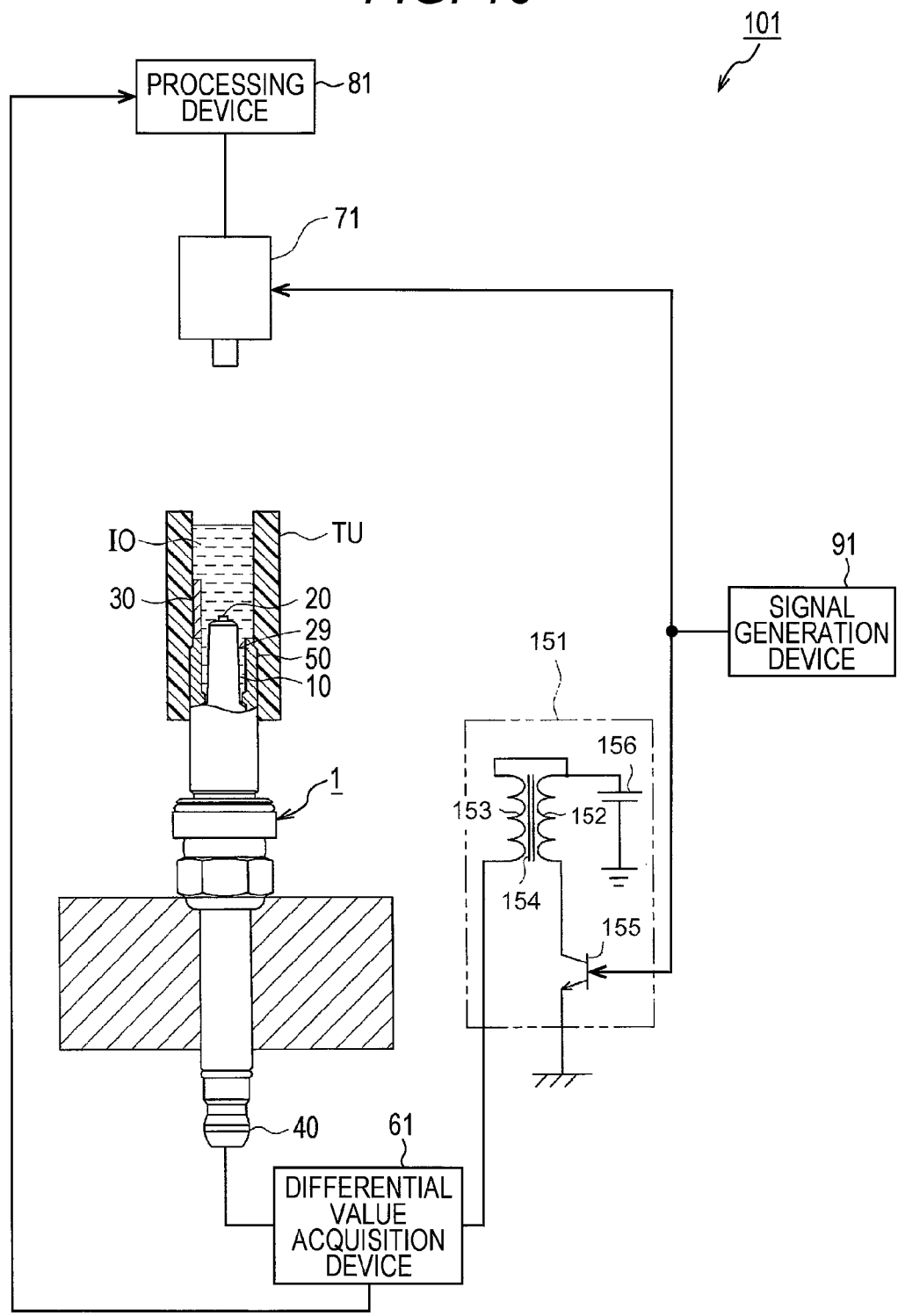
FIG. 10 is a schematic diagram of a configuration of the inspection device according to a third embodiment.

According to the third embodiment, the steps up to the judgment step are performed as in the first embodiment, and then a determination step is performed as will be described below. In the following, the determination step will be described with reference to the drawings. FIG. 10 is a schematic diagram of a configuration of a second inspection device 101 for the spark plug 100. The second inspection device 101 is used in the determination step in the process of manufacturing the spark plug 100.

As shown in FIG. 10, the second inspection device 101 includes a voltage application device 151, a differential value acquisition device 61, an imaging device 71, a processing device 81, and a signal generation device 91. The voltage application device 151 applies a high voltage to the center electrode 20 and includes a primary coil 152, a secondary coil 153, a core 154, an igniter 155, and a battery 156 for electrode feeding.

Figure 12A:
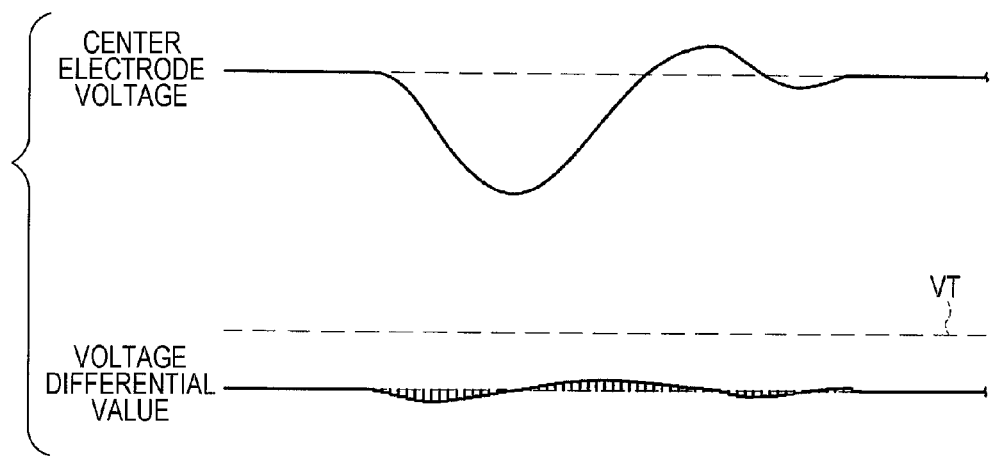
FIG. 12(a) is a graph indicating the voltage applied to the center electrode and the differential value of the applied voltage in a case where no discharge was produced between the center electrode and the metal shell.

The differential value acquisition device 61 is disposed in an electricity transmitting path between the spark plug 100 and the voltage application device 151, and is a device for acquiring a differential value of the voltage applied to the center electrode 20. When no discharge (flash over or through discharge) is caused between the center electrode 20 and the metal shell 50 upon application of the voltage to the center electrode 20, the voltage applied to the center electrode 20 varies relatively gradually, as shown in FIG. 12(a), so that the absolute value of each differential value becomes relatively small.

Figure 12B:
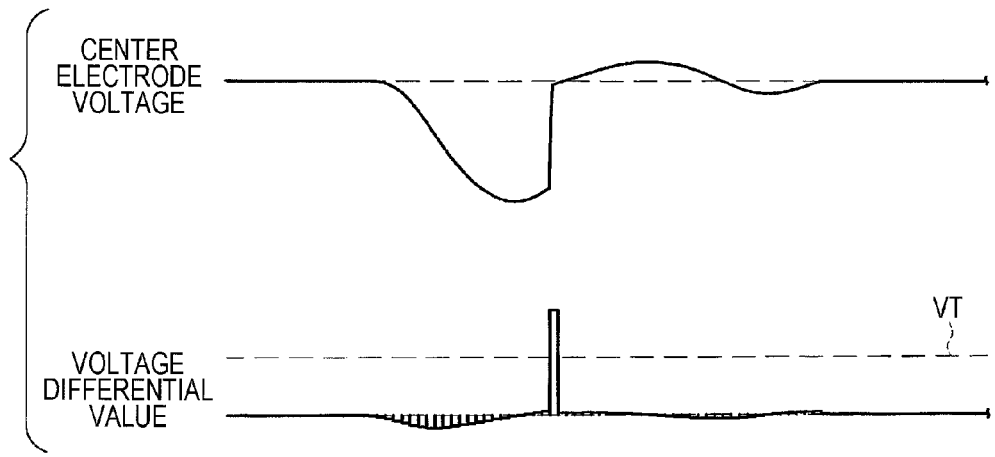
FIG. 12(b) is a graph indicating the voltage applied to the center electrode and the differential value of the applied voltage in a case where discharge was caused between the center electrode and the metal shell.

On the other hand, when discharge (flash over or through discharge) is caused between the center electrode 20 and the metal shell 50 upon application of the voltage to the center electrode 20, the voltage applied to the center electrode 20 is sharply changed at the time of discharge, as shown in FIG. 12(b), so that a differential value with a relatively large absolute value is exhibited. According to the present embodiment, the differential value acquisition device 61 is configured to output a predetermined determination-implementation request signal to the processing device 81 when the obtained differential value is not less than a preset determination implementation threshold VT.

Figure 11:
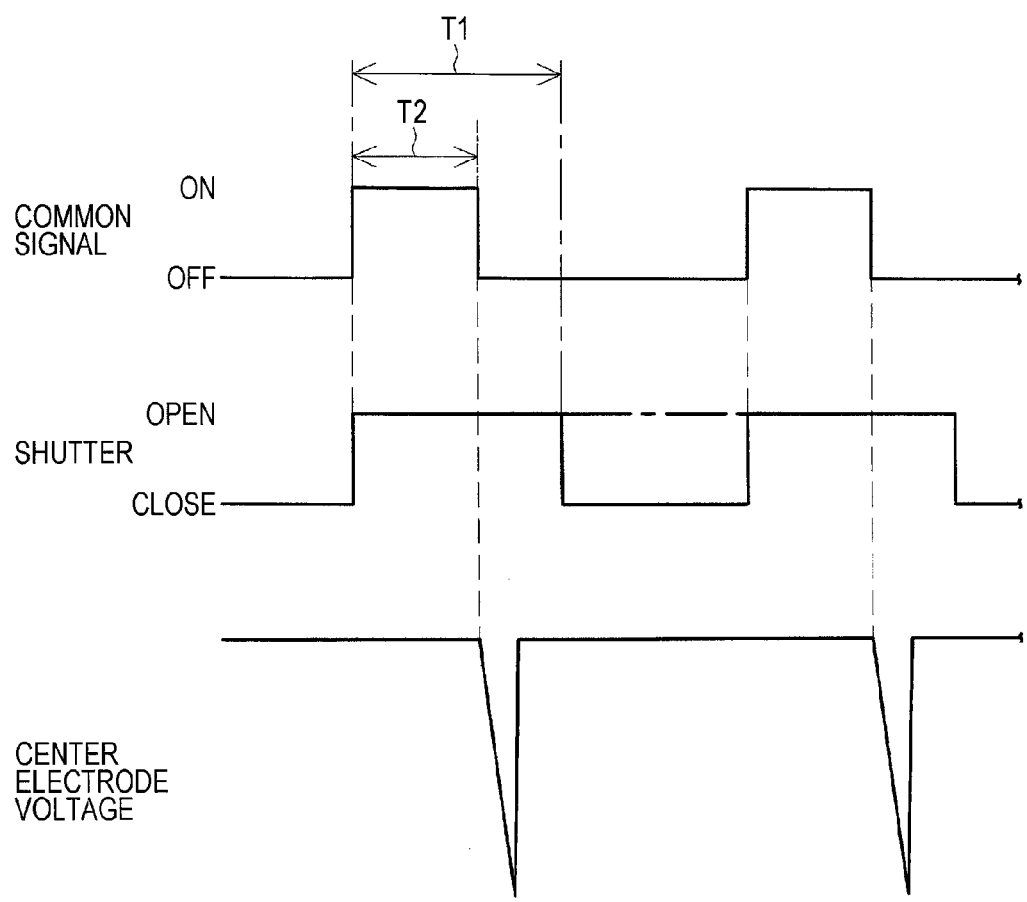

The imaging device 71 includes a predetermined CCD camera to obtain an image by imaging the tip end of the spark plug 100 disposed in a dark place from the front end side in the axial line CL direction. Specifically, the imaging device 71 images an area including at least the center electrode 20, the insulator 10, and the annular space 29 from the front end side in the axial line CL direction to obtain an image including the area. Based on a common signal input from the signal generation device 91, the shutter opening timing in the imaging device 71 (i.e., the time (timing) of imaging) is controlled. Namely, as shown in FIG. 11, when the common signal input from the signal generation device 91 is on, the shutter is opened to start imaging the spark plug 100.

In the imaging device 71, a shutter open time (imaging time) T2 is set sufficiently longer than a time T1 between on and off of the common signal. Thus, the voltage is applied to the center electrode 20 from the voltage application device 151 when the shutter is open, whereby the imaging device 71 can image the spark plug 100 while the voltage is being applied to the center electrode 20.

In addition, the captured image by the imaging device 71 is input to the processing device 81. The processing device 81 determines the presence or absence of electrical breakdown in the insulator 10 based on the captured image only when the determination-implementation request signal is input from the differential value acquisition device 61. Namely, it is determined whether the discharge caused is flash over (no electrical breakdown is caused in the insulator 10) or through discharge (electrical breakdown is caused in the insulator 10) only for the spark plugs 100 in which discharge was caused between the center electrode 20 and the metal shell 50. According to the present embodiment, the processing device 81 determines the presence or absence of electric breakdown in the insulator 10 on the basis of information based on the brightness in an area of the captured image that includes the insulator 10 and the annular space 29, and a preset threshold.

Specifically, the processing device 81 obtains a binarized image by subjecting the area to a binarization process by comparing the brightness (corresponding to the "information" in the present invention) of each pixel in the area of the captured image including the insulator 10 and the annular space 29 with the threshold. Then, the coordinates of the center of gravity of a portion indicating higher brightness in the binarized image are calculated, and the presence or absence of electrical breakdown in the insulator 10 is determined based on the calculated coordinates of the center of gravity.

Figure 13:
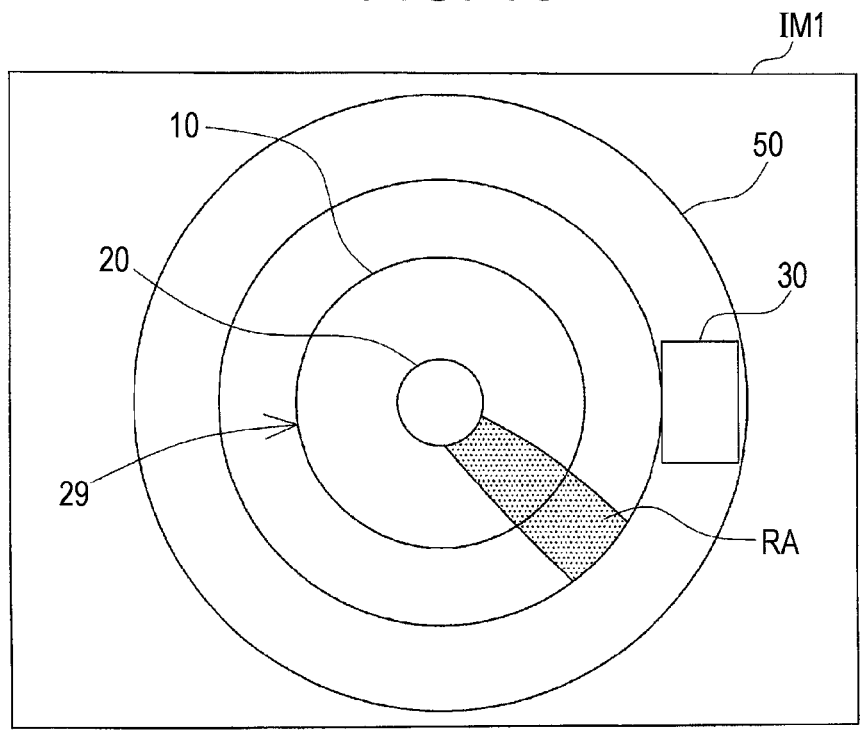
FIG. 13 is a schematic diagram of a captured image in a case where flash over was caused.
Figure 14:
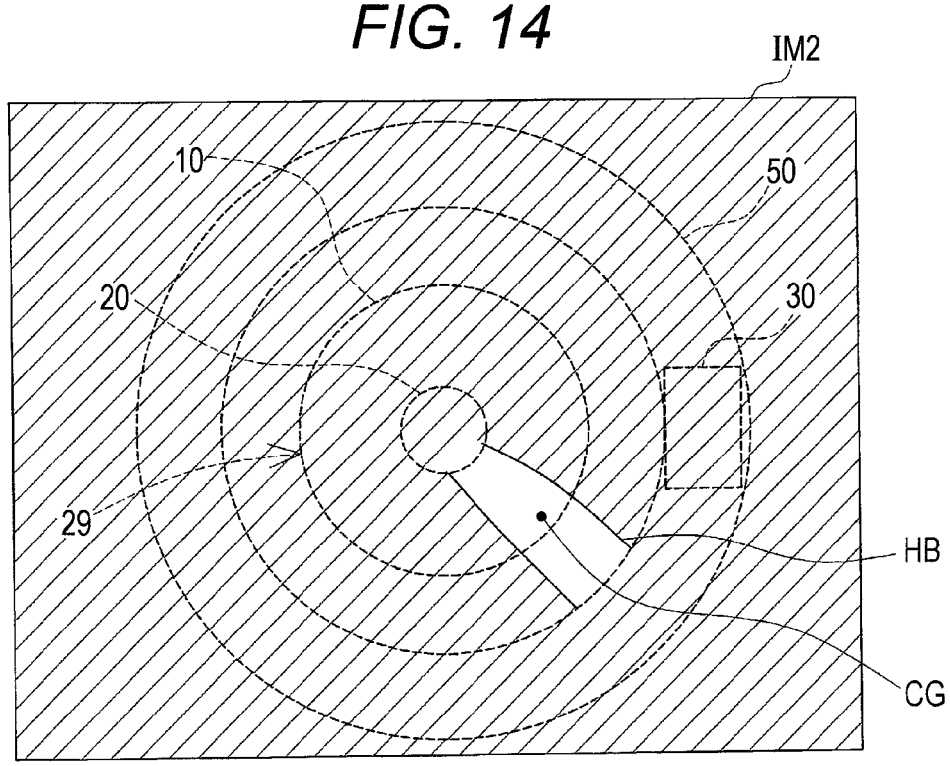
FIG. 14 is a schematic diagram of a binarized image in the case where flash over was caused.

Specifically, when flash over is caused, as shown in FIG. 13, in an image IM1 obtained by imaging, a portion RA with high brightness (a high brightness portion due to discharge; the portion indicated by dotted pattern in FIG. 13) is continuous from the area in which the center electrode 20 is positioned to the area in which the annular space 29 is positioned. In a binarized image IM2 obtained by subjecting the image IM1 to the binarization process, as shown in FIG. 14 (the portion with hatching in FIG. 14 is a portion with lower brightness), a portion HB indicating higher brightness is continuous from the area in which the center electrode 20 is positioned to the area in which the annular space 29 is positioned, and the coordinates of the center of gravity CG of the portion HB are at a position relatively close to the center of the center electrode 20.

Thus, when the position of the coordinates of the center of gravity CG is on the center electrode 20 side (for example, when the distance between the coordinates of the center of gravity CG and the center of the center electrode 20 is not more than a predetermined value, such as when the coordinates of the center of gravity CG are within the area in which the insulator 10 is positioned), it is determined that flash over was caused and electrical breakdown was not caused in the insulator 10 (Namely, the insulating performance of the insulator 10 is good).

Figure 15:
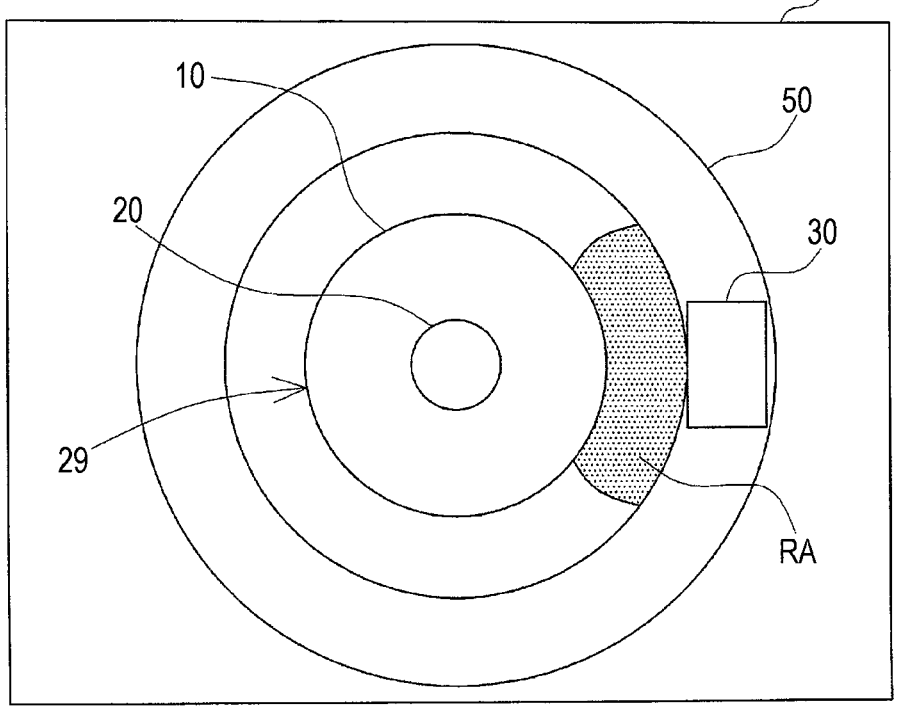
FIG. 15 is a schematic diagram of a captured image in a case where through discharge was caused.
Figure 16:
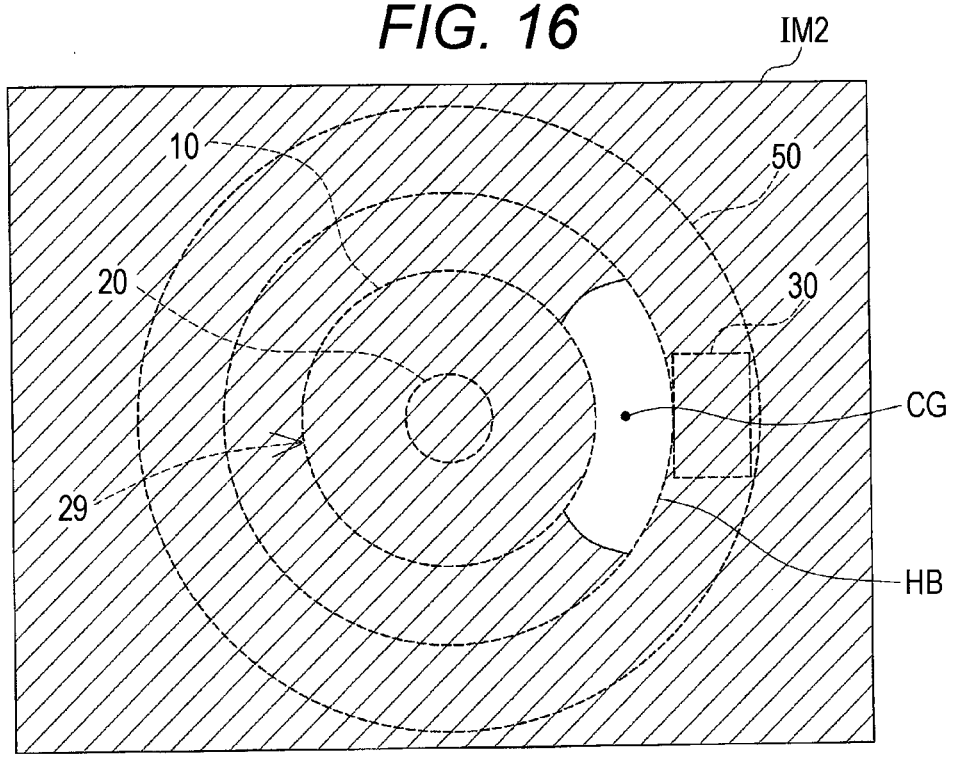
FIG. 16 is a schematic diagram of a captured image in the case where through discharge was caused.

On the other hand, when through discharge is caused, as shown in FIG. 15, the high brightness portion RA (the high brightness portion due to discharge; the portion indicated by dotted pattern in FIG. 15) in the image IM1 obtained by imaging is mainly present in the area in which the annular space 29 is positioned. In the binarized image IM2 obtained by subjecting the image IM1 to the binarization process, as shown in FIG. 16 (in FIG. 16, the portion with hatching is a portion indicating lower brightness), the portion HB indicating higher brightness is mainly present in the area in which the annular space 29 is positioned, and the coordinates of the center of gravity CG of the portion HB was present at a position relatively spaced apart from the center of the center electrode 20.

Thus, when the position of the coordinates of the center of gravity CG is at the position spaced apart from the center of the center electrode 20 (when the distance between the coordinates of the center of gravity CG and the center of the center electrode 20 is greater than the predetermined value, such as when the coordinates of the center of gravity CG are in the area in which the annular space 29 is positioned), it is determined that through discharge was caused and electrical breakdown was caused in the insulator 10 (i.e., there is a problem in the insulating performance of the insulator 10).

The processing device 81 is configured to display the result of determination on a predetermined display means (not shown).

The signal generation device 91 outputs the common signal input to the voltage application device 151 and the imaging device 71. According to the present embodiment, as described above, the timing of application of voltage to the center electrode 20 from the voltage application device 151, and the time of acquisition (imaging timing) of the image by the imaging device 71 are controlled based on the single common signal.

Next, the insulating performance of the insulator 10 is inspected by using the second inspection device 101. First, as shown in FIG. 10, the spark plug 100 is supported with the tip end facing upward, and the tip end of the metal shell 50 is inserted into a cylindrical tube TU. Then, insulating oil IO is poured into the tube TU until the annular space 29 is filled with the insulating oil IO, thus disposing the insulating oil IO around the tip ends of the center electrode 20 and the insulator 10.

In this way, the insulating resistance value between the tip end of the center electrode 20 and the metal shell 50 can be increased, whereby the occurrence of flash over can be suppressed (However, this does not mean that flash over will never be caused). According to the present embodiment, the insulating oil IO is transparent with the turbidity of not more than 100 NTU ("NTU" is the Formazin turbidity measurement unit according to Formazin turbidity standard).

Then, the common signal output from the signal generation device 91 is turned on. Thereby, the shutter of the imaging device 71 is opened, and imaging of an area including the center electrode 20 and the insulator 10 and the like through the insulating oil IO is started, and transmission of electricity to the primary coil 52 from the battery 56 is started. Then, the common signal is switched from being on to off, whereby voltage is applied to the center electrode 20 from the voltage application device 151, and an image of the spark plug 100 during the application of the voltage to the center electrode 20 is obtained by the imaging device 71. The captured image is input to the processing device 81.

The processing device 81 does not determine the presence or absence of electrical breakdown in all of the input images obtained by imaging; rather, the processing device 81 determines the presence or absence of electrical breakdown only in the captured image the spark plug 100 for which the determination-implementation request signal has been input from the differential value acquisition device 61. The presence or absence of electrical breakdown is determined based on the coordinates of the center of gravity CG of the portion HB with higher brightness in the binarized image obtained from the captured image, as described above. Then, the result of determination is displayed on the display means.

As described above in detail, according to the present embodiment, flash over and through discharge (the presence or absence of electrical breakdown) can be more reliably distinguished based on the captured image from the front end side in the axial line CL direction. As a result, the quality of insulating performance in the insulator 10 can be more accurately determined, whereby an improvement in yield can be achieved.

C-2. Effects

According to the third embodiment, the determination step is additionally performed after the judgment step, whereby the presence or absence of dielectric breakdown in the insulator can be more accurately determined.

Further, the time of acquisition of the image by imaging and the timing of application of voltage to the center electrode 20 are controlled based on a single common signal. Thus, the time (timing) of acquisition of the image by imaging and the timing of application of voltage to the center electrode 20 can be easily aligned, so that the spark plug 100 can be more reliably imaged while voltage is being applied to the center electrode 20 (when discharge is being caused momentarily). As a result, the presence or absence of electrical breakdown can be more accurately determined based on the captured image, whereby the inspection accuracy can be further increased.

In addition, according to the present embodiment, the presence or absence of electrical breakdown in the insulator 10 can be automatically determined by the processing device 81. Thus, inspection accuracy can be further increased, and the inspection time can be decreased.

Further, according to the present embodiment, the presence or absence of electrical breakdown is not determined in all of the images obtained by imaging; rather, the embodiment is configured to judge the presence or absence of electrical breakdown when the differential value of the voltage applied to the center electrode 20 is not less than the determination implementation threshold VT. Namely, only those spark plugs 100 in which discharge (flash over or through discharge) was caused between the center electrode 20 and the metal shell 50 upon application of voltage to the center electrode 20 are considered as the targets for inspection. Thus, the processing burden for inspection can be decreased, and the inspection time can be further shortened.

D. Modification

Some of the constituent elements in the foregoing embodiments may be additional elements and may be omitted as needed. Further, the present invention is not limited to the above embodiments and may be implemented in various forms without departing from the gist of the invention. For example, the following modifications can be made.

D1. First Modification

According to the first embodiment, a predetermined value between the integral of through discharge and the integral of air discharge is used as the predetermined threshold. However, the invention is not limited to such an embodiment. Namely, the judgment step may be performed by using at least one of a range of integrals of air discharge (which may also be referred to as a "first integral range") and a range of integrals of through discharge (which may also be referred to as a "second integral range") that are determined in advance. For example, when the first integral range determined in advance is utilized in the judgment step, the integral calculated in the calculation step and the first integral range are compared. When the calculated integral is within the first integral range, it is judged that air discharge was caused. When the calculated integral is outside the first integral range, it is judged that through discharge was caused. When the second integral range that is determined in advance is utilized in the judgment step, for example, the ratio calculated in the calculation step and the second integral range are compared. When the calculated integral is within the second integral range, it is judged that through discharge was caused. When the calculated ratio is outside the second integral range, it is judged that air discharge was caused.

D-2. Second Modification

According to the second embodiment, the predetermined threshold is a value between the range (first ratio range) in which the ratios of the first and the second integrals calculated based on the acoustic emission (AE) caused by air discharge are distributed, and the range (second ratio range) in which the ratios of the first and the second integrals calculated based on the AE caused by through discharge are distributed. However, the present invention is not limited to such an embodiment. Namely, the judgment step may be performed by utilizing at least one of the first ratio range and the second ratio range that are determined in advance. For example, when the predetermined first ratio range is utilized in the judgment step, it is judged that air discharge was caused when the ratio calculated in the calculation step is within the first ratio range. When the ratio calculated in the calculation step is outside the first ratio range, it is judged that through discharge was caused. When the predetermined second ratio range is utilized in the judgment step, for example, it is judged that through discharge was caused when the ratio calculated in the calculation step is within the second ratio range. When the ratio calculated in the calculation step is outside the second ratio range, it is judged that air discharge was caused.

D-3. Third Modification (a) In the third embodiment, the differential value acquisition device 61 is configured to output the determination-implementation request signal to the processing device 81 when the obtained differential value is not less than the judgment implementation threshold VT. However, the differential value acquisition device 61 may be configured to output the determination-implementation request signal to the processing device 81 when the differential value is greater than the judgment implementation threshold VT.

(b) In the third embodiment, the processing device 81 determines the presence or absence of electrical breakdown in the insulator 10 based on the coordinates of the center of gravity CG of the portion HB with higher brightness in the binarized image IM2. However, the presence or absence of electrical breakdown may be determined based on whether the portion HB with higher brightness in the binarized image IM2 is continuous from the area in which the center electrode 20 is positioned to the area in which the annular space 29 is positioned.

Specifically, because flash over is caused in such a manner as to connect the tip end of the center electrode 20 and the metal shell 50, a high brightness portion connecting the center electrode 20 and the metal shell 50 is present in the captured image. In light of this, when the portion HB with higher brightness is continuous from the area in which the center electrode 20 is positioned to the area in which the annular space 29 is positioned, the processing device 81 determines that flash over was caused, and that no electrical breakdown was caused in the insulator 10 (i.e., that the insulating performance of the insulator 10 is good).

On the other hand, because through discharge penetrates the insulator 10, the portion HB with higher brightness in the captured image is present only in the annular space 29 and its surrounding areas, and not around the tip end of the center electrode 20. In light of this, when the portion HB with higher brightness in the binarized image is not continuous from the area in which the center electrode 20 is positioned to the area in which the annular space 29 is positioned, the processing device 81 determines that through discharge was caused and that electrical breakdown was caused in the insulator 10 (i.e., that there is a problem in insulating performance).

(c) In the third embodiment, the presence or absence of electrical breakdown in the insulator 10 is determined based on the binarized image obtained from the captured image. However, the binarized image need not necessarily be obtained; instead, the presence or absence of electrical breakdown may be determined based on the captured image.

For example, the presence or absence of electrical breakdown in the insulator 10 may be determined by determining the brightness of each pixel in the area of the captured image including the insulator 10 and the annular space 29, calculating the mean brightness (corresponding to the "information" in the present invention) in the area, and comparing the calculated mean brightness with a preset threshold.

Figure 17:
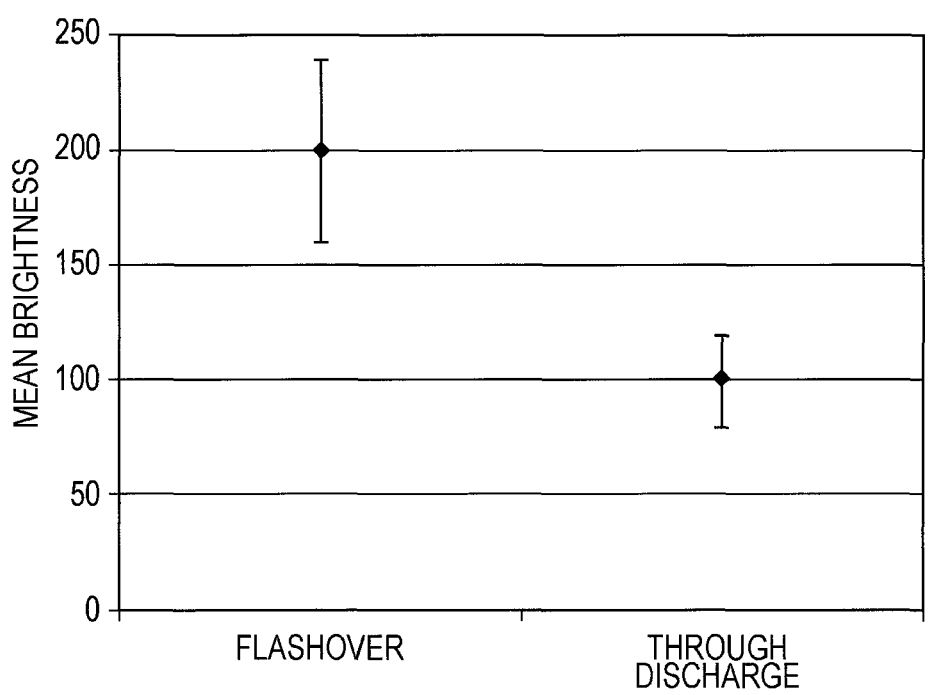
FIG. 17 is a graph indicating mean brightness in the case where flash over was caused, and mean brightness in the case where through discharge was caused.

Specifically, because flash over is caused in such a manner as to crawl over the tip face of the insulator 10 between the tip end of the center electrode 20 and the metal shell 50, the light reaches the imaging device 71 easily, and the brightness becomes relatively large in the area in which the insulator 10 is positioned and in the area in which the annular space 29 is positioned. Thus, the brightness of each pixel in these areas becomes relatively large in the captured image, so that the mean brightness is also increased, as shown in FIG. 17. In light of this, when the mean brightness is not less than the threshold, or greater than the threshold, the processing device 81 determines that flash over was caused and that electrical breakdown was not caused in the insulator 10 (i.e., that the insulating performance of the insulator 10 is good).

On the other hand, in the case of through discharge, because the discharge is caused in the annular space 29, the light reaches the imaging device 71 less easily, so that, although the brightness of the area in which the annular space 29 is positioned becomes relatively large, the brightness of the area in which the insulator 10 is positioned is relatively small, and therefore the mean brightness is also relatively small. In light of this, when the mean brightness is less than the threshold, or not more than the threshold, the processing device 81 determines that through discharge was caused and that electrical breakdown was caused in the insulator 10 (i.e., that there is a problem in the insulating performance of the insulator 10).

For example, the presence or absence of electrical breakdown in the insulator 10 may be determined by determining the brightness (corresponding to the "information" according to the present invention) of each pixel in the area of the captured image including the insulator 10 and the annular space 29, and based on the total quantity of the pixels whose brightness satisfies a preset relationship with a preset threshold (in the present additional example, based on the total quantity of the pixels whose brightness is not less than the threshold, or more than the threshold).

Specifically, when flash over is caused, the number of pixels with high brightness in the area is increased, so that the total quantity also becomes relatively large. In light of this, when the total quantity is not less than a preset judgment value, or more than the judgment value, the processing device 81 determines that flash over was caused and that no electrical breakdown was caused in the insulator 10 (i.e., that the insulating performance of the insulator 10 is good).

On the other hand, when through discharge is caused, the number of pixels with high brightness is decreased in the area, so that the total quantity also becomes relatively small. In light of this, when the total quantity is less than the judgment value, or not more than the judgment value, the processing device 81 determines that through discharge was caused and that electrical breakdown was caused in the insulator 10 (i.e., that there is a problem in the insulating performance of the insulator 10). While the relationship is that of magnitude between the brightness and the threshold according to the present additional example, the relationship may be modified as needed.

(d) In the third embodiment, at the time of insulating performance inspection, the voltage is applied to the center electrode 20 with the insulating oil IO disposed around the tip ends of the center electrode 20 and the insulator 10 so as to suppress the occurrence of flash over. However, the voltage may be applied to the center electrode 20 with high pressure gas (such as high pressure air) filled around the tip ends of the center electrode 20 and the insulator 10. The insulating oil IO or the high pressure gas may not necessarily be used at the time of insulating performance inspection.

(e) In the third embodiment, the processing device 81 determines the presence or absence of electrical breakdown only in the captured image of the spark plug 100 for which the determination-implementation request signal is input from the differential value acquisition device 61. However, the presence or absence of electrical breakdown may be determined in all of the images obtained by imaging.

DESCRIPTION OF THE REFERENCE NUMERALS

3 Ceramic resistor
4 Sealing member
5 Gasket
10 Insulator (insulation)
12 Axial hole
13 Insulator nose portion
17 Front end-side body portion
18 Rear end-side body portion
19 Middle body portion
20 Center electrode
21 Tip end
29 Annular space
30 Ground electrode
40 Terminal metal fitting
50 Metal shell
51 Tool engaging portion
52 Installation thread portion
54 Sealing portion
60 Inspection device
62 Installation mount
65 Casing
66 Pressurizing cap
68 Circulation flow passage
72 Space
100 Spark plug
100$t$ Specimen
600 Engine head
601 Installation thread opening
G Spark gap
CL Axial line
S24$a$ Step
S26$a$ Step
DT Power spectrum
Dw Raw waveform
IM1 Captured image
IM2 Binarized image

The invention claimed is:

1. A method for manufacturing a spark plug comprising:
a preparation step of preparing a specimen including a bar-shaped center electrode, an insulator disposed on an outer periphery of the center electrode, a metal shell disposed on an outer periphery of the insulator, and a ground electrode with one end attached to the metal shell for forming a spark gap with the center electrode; and
an inspection step of determining whether dielectric breakdown is caused in the insulator by applying a predetermined voltage between the ground electrode and the center electrode of the prepared specimen,
wherein the inspection step includes;
a calculation step of receiving an oscillating wave generated from the specimen upon application of the predetermined voltage to the specimen, determining a power spectrum by subjecting an oscillating wave signal representing the oscillating wave to fast Fourier transform, and then calculating an integral of a predetermined frequency range in the power spectrum, and
a judgment step of judging whether discharge is caused by dielectric breakdown of the insulator by utilizing the integral.

2. The method for manufacturing a spark plug according to claim 1, wherein the judgment step judges whether discharge is caused by dielectric breakdown of the insulator by comparing the integral with a predetermined threshold.

3. The method for manufacturing a spark plug according to claim 1, wherein:
the calculation step includes a step of calculating a ratio of a first integral that is the integral of a first frequency range included in the predetermined frequency range in the power spectrum, and a second integral that is the integral of a second frequency range included in the predetermined frequency range and different from the first frequency range; and the judgment step judges whether discharge is caused by dielectric breakdown of the insulator based on the ratio.

4. The method for manufacturing a spark plug according to claim 1, wherein the predetermined frequency range is not higher than 1 MHz.

5. The method for manufacturing a spark plug according to claim 1, wherein the inspection step includes, before applying the predetermined voltage, filling a space including a tip end of the center electrode with one of a compressed gas compressed to a pressure higher than atmospheric pressure and an insulating fluid.

6. The method for manufacturing a spark plug according to claim 1, further comprising:

a decision step of calculating a first specific integral that is the integral determined from the oscillating wave generated from the specimen by discharge due to dielectric breakdown of the insulator, and a second specific integral that is the integral determined from the oscillating wave generated from the specimen by discharge not due to dielectric breakdown of the insulator, for each of a plurality of different frequency ranges of the power spectrum, and deciding on a specific frequency range such that the difference between the first and the second specific integrals is maximized from among the plurality of different frequency ranges; wherein the calculation step uses the specific frequency range determined in the decision step as the predetermined frequency range.

7. The method for manufacturing a spark plug according to claim 1, further comprising a bending step of bending the ground electrode so as to bring another end of the ground electrode closer to the center electrode, wherein the bending step is performed after the inspection step.

8. The method for manufacturing a spark plug according to claim 1, further comprising an assembly step of assembling a gasket to an outer periphery of the metal shell after the inspection step.

9. The method for manufacturing a spark plug according to claim 1, further comprising an elimination step of eliminating, after the inspection step, the specimen judged to have caused discharge due to dielectric breakdown of the insulator in the inspection step from the manufacturing process as a defective article.

10. The method for manufacturing a spark plug according to claim 1, wherein:

the insulator includes an axial hole extending in an axial line direction with the center electrode inserted into the axial hole on a front end side;

the spark plug includes an annular space formed by an outer peripheral surface of the insulator and an inner peripheral surface of the metal shell and opened on the front end side; and the inspection step further includes a determination step of applying, after the judgment step, the predetermined voltage to the specimen, imaging an area including at least the center electrode, the insulator, and the annular space from the front end side in the axial line direction upon application of the predetermined voltage, and determining the presence or absence of dielectric breakdown based on an image obtained by the imaging.

* * * * *